(12) United States Patent
Zhu et al.

(10) Patent No.: US 11,015,116 B2
(45) Date of Patent: *May 25, 2021

(54) COATED NARROW BAND GREEN PHOSPHOR

(71) Applicant: Intematix Corporation, Fremont, CA (US)

(72) Inventors: Haoguo Zhu, Fremont, CA (US); Yi-Qun Li, Danville, CA (US); Kuanping Gong, Union City, CA (US); Samuel Lowell Dunscombe, Albany, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/814,110

(22) Filed: Mar. 10, 2020

(65) Prior Publication Data

US 2020/0208049 A1 Jul. 2, 2020

Related U.S. Application Data

(63) Continuation of application No. 15/775,318, filed as application No. PCT/US2017/057719 on Oct. 20, 2017, now Pat. No. 10,584,280.

(Continued)

(51) Int. Cl.
*C09K 11/02* (2006.01)
*C09K 11/77* (2006.01)
(Continued)

(52) U.S. Cl.
CPC ........ *C09K 11/025* (2013.01); *C09K 11/7731* (2013.01); *C09K 11/7786* (2013.01);
(Continued)

(58) Field of Classification Search
None
See application file for complete search history.

(56) References Cited

U.S. PATENT DOCUMENTS

2007/0267965 A1    11/2007   Igarashi et al.
2017/0263592 A1*    9/2017   Schmidt ............... C09K 11/886

FOREIGN PATENT DOCUMENTS

EP    2386617 A1    11/2011
EP    2789671 A1    10/2014
(Continued)

OTHER PUBLICATIONS

EPO Opinion, dated May 2020; EP17863502.
(Continued)

*Primary Examiner* — Elmito Breval
(74) *Attorney, Agent, or Firm* — CrossPond Law

(57) ABSTRACT

A coated phosphor may comprise: phosphor particles comprised of a phosphor with composition $(M)(A)_2S_4$:Eu, wherein: M is at least one of Mg, Ca, Sr and Ba; and A is at least one of Ga, Al, In, Y; a dense impermeable (pinhole-free) coating of an oxide material encapsulating individual ones of the phosphor particles. The coated phosphor is configured to satisfy one or more of the conditions: (1) under excitation by blue light, the reduction in photoluminescent intensity at the peak emission wavelength after 1,000 hours of aging at about 85° C. and about 85% relative humidity is no greater than about 30%; (2) the change in chromaticity coordinates CIE(y), ΔCIE y, after 1,000 hours of aging at about 85° C. and about 85 % relative humidity is less than about $5\times10^{-3}$; (3) said coated phosphor does not turn black when suspended in a 1 mol/L silver nitrate solution for at least two hours at 85° C.; (4) said coated phosphor does not turn black when suspended in a 1 mol/L silver nitrate solution for at least one day at 20° C.; and (5) said coated (Continued)

phosphor does not turn black when suspended in a 1 mol/L silver nitrate solution for at least 5 days at 20° C.

17 Claims, 35 Drawing Sheets

Related U.S. Application Data

(60) Provisional application No. 62/496,901, filed on Oct. 31, 2016.

(51) Int. Cl.
*H01L 33/50* (2010.01)
*F21K 9/64* (2016.01)
*H01L 33/32* (2010.01)
*H01L 33/48* (2010.01)
*H01L 33/56* (2010.01)
*H01L 33/60* (2010.01)
*H01L 33/62* (2010.01)

(52) U.S. Cl.
CPC .............. *F21K 9/64* (2016.08); *H01L 33/504* (2013.01); *H01L 33/507* (2013.01); *H01L 33/32* (2013.01); *H01L 33/486* (2013.01); *H01L 33/56* (2013.01); *H01L 33/60* (2013.01); *H01L 33/62* (2013.01)

(56) References Cited

FOREIGN PATENT DOCUMENTS

| | | |
|---|---|---|
| EP | 2878646 A1 | 6/2015 |
| JP | 2003286480 A | 10/2003 |
| JP | 2006265326 A | 10/2006 |
| JP | 2009526089 A | 7/2009 |
| JP | 2014519540 A | 8/2014 |
| JP | 2015063619 A | 4/2015 |
| WO | 2007105845 A1 | 9/2007 |
| WO | 2012077656 A1 | 6/2012 |

OTHER PUBLICATIONS

Supplemental European Search Report, dated May 2020; EP17863502.
Office Action and translation, dated Mar. 2020; JP 2019-523643.
Office Action, KR10-2019-7015672, dated Oct. 14, 2020.

\* cited by examiner

SECTION A-A

COATED NARROW BAND GREEN PHOSPHOR

This application claims priority to U.S. patent application Ser. No. 15/775,318, now U.S. Pat. No. 10,584,280, filed May 10, 2018, which in turn is a national phase application of PCT Application PCT/US17/57719, filed Oct. 20, 2017, which in turn claims the benefit of priority to U.S. Provisional Application Ser. No. 62/496,901, filed Oct. 31, 2016, each of which is hereby incorporated by reference in its entirety.

FIELD OF THE INVENTION

Embodiments of the invention are directed to narrow band green and coated narrow band green phosphors with general composition based on $MA_2S_4$:Eu, wherein: M comprises at least one of Mg, Ca, Sr and Ba, A comprises at least one of Ga, Al, In, La and Y, and the coating is one or more oxides chosen from the group of materials including aluminum oxide, silicon oxide, titanium oxide, zinc oxide, magnesium oxide, zirconium oxide and chromium oxide, and light emitting devices including the same.

BACKGROUND OF THE INVENTION $MGa_2S_4$:Eu materials, where M comprises at least one of Mg, Ca, Sr and Ba, show green color emission around 535 nm, and provide high lumen efficacy of LED lighting. However, the narrow band green phosphors with general composition $MGa_2S_4$:Eu are hygroscopic, and exhibit rapid deterioration of photoluminescence due to exposure to moisture (water vapor), oxygen and/or heat. There is a need for narrow band green phosphors with general composition $MGa_2S_4$:Eu, with coatings which are effective at protecting the phosphor particles from moisture and oxygen and enable a commercially useful phosphor.

Furthermore, there is a need for new compositions of narrow band green phosphors based on the phosphor with general composition $MA_2S_4$:Eu, wherein: M comprises at least one of Mg, Ca, Sr and Ba, A comprises at least one of Ga, Al, In, La and Y, providing improved lumen maintenance and stable chromaticity over the lifetime of a light emitting device.

SUMMARY OF THE INVENTION

Embodiments of the invention concern narrow band green phosphors with general composition based on $MA_2S_4$:Eu, wherein: M comprises at least one of Mg, Ca, Sr and Ba, A comprises at least one of Ga, Al, In, La and Y, having a dense impermeable (i.e. pinhole-free) coating of an oxide material encapsulating individual ones of phosphor particles.

According to a first aspect of the present invention, there is provided a coated phosphor comprises phosphor particles comprised of a phosphor material with composition $(M)(A)_2S_4$:Eu, wherein: M is at least one of Mg, Ca, Sr and Ba; and A is at least one of Ga, Al, In, Y; and a dense impermeable coating of an oxide material encapsulating individual ones of said phosphor particles; and wherein said coated phosphor is configured to satisfy at least one of the conditions: (1) under excitation by blue light, the reduction in photoluminescent intensity at the peak emission wavelength after 1,000 hours of aging at about 85° C. and about 85% relative humidity is no greater than about 30%; (2) the change in chromaticity coordinates CIE(y), ΔCIE y, after 1,000 hours of aging at about 85° C. and about 85% relative humidity is less than about $5\times10^{-3}$; (3) said coated phosphor does not turn black when suspended in a 1 mol/L silver nitrate solution for at least two hours at 85° C.; (4) said coated phosphor does not turn black when suspended in a 1 mol/L silver nitrate solution for at least one day at 20° C.; and (5) said coated phosphor does not turn black when suspended in a 1 mol/L silver nitrate solution for at least 5 days at 20° C.

The coated phosphor may be configured such that the change in chromaticity coordinates CIE(y), ΔCIE y, after 1,000 hours of aging at about 85° C. and about 85% relative humidity is less than or equal to about $3\times10^{-3}$.

The oxide may be one or more materials chosen from the group comprising aluminum oxide, silicon oxide, titanium oxide, zinc oxide, magnesium oxide, zirconium oxide and chromium oxide.

In some embodiments, the oxide material may be alumina.

The coating may have a thickness in the range of 100 nm to 5 μm or in the range of 800 nm to 1.2 μm.

The phosphor particles may have a size distribution having a $D_{50}$ value within the range of 5 μm to 15 μm.

In some embodiments, M may be Sr.

In some embodiments, A may be Ga.

In some embodiments, A may be Ga, M may be Sr and said oxide material may be alumina.

The coated phosphor may have a peak photoluminescence between 535 nm and 537 nm and a FWHM of between 48 nm and 50 nm, when excited by blue light with a peak emission of about 450 nm.

The phosphor material composition in accordance with embodiments described herein may further comprise Praseodymium (Pr). The Pr may act as a co-activator and the inventors have discovered that this can improve the quantum efficiency of the phosphor and increase emission intensity by 5-8%. The co-activation of a narrow band green phosphor of composition $(M)(A)_2S_4$ with Eu and Pr is believed to be inventive in its own right. Thus, according to some embodiments, a coated phosphor may comprise phosphor particles comprised of a phosphor material with composition $(M)(A)_2S_4$:Eu; Pr, wherein: M is at least one of Mg, Ca, Sr and Ba; and A is at least one of Ga, Al, In, Y; a dense impermeable coating of an oxide material encapsulating individual ones of said phosphor particles. In some embodiments, the coated phosphor may comprise particles phosphor particles comprised of a phosphor material with composition $SrGa_2S_4$:Eu; Pr having a dense impermeable coating of alumina encapsulating individual ones of said phosphor particles.

In another aspect, the present invention encompasses a method of forming a coated phosphor, comprising: providing phosphor particles comprised of a phosphor material with composition $(M)(A)_2S_4$:Eu wherein: M is at least one of Mg, Ca, Sr and Ba; and A is at least one of Ga, Al, In, Y; and depositing a dense impermeable coating of an oxide material encapsulating individual ones of said phosphor particles by a gas phase process in a fluidized bed reactor; wherein said coated phosphor is configured to satisfy at least one of the conditions: (1) under excitation by blue light, the reduction in photoluminescent intensity at the peak emission wavelength after 1,000 hours of aging at about 85° C. and about 85% relative humidity is no greater than about 30%; (2) the change in chromaticity coordinates CIE(y), ΔCIE y, after 1,000 hours of aging at about 85° C. and about 85% relative humidity is less than about $5\times10^{-3}$; (3) said coated phosphor does not turn black when suspended in a 1 mol/L silver nitrate solution for at least two hours at 85° C.; (4) said coated phosphor does not turn black when suspended in a 1 mol/L silver nitrate solution for at least one day at 20° C.;

and (5) said coated phosphor does not turn black when suspended in a 1 mol/L silver nitrate solution for at least 5 days at 20° C. Of course, it will be understood that the method encompasses forming a coated phosphor which may comprise phosphor particles comprised of a phosphor material with composition $(M)(A)_2S_4$:Eu; Pr in the same manner as that described above.

It will be appreciated that the method of forming a coated phosphor encompasses forming the various coated phosphors described herein.

In a further aspect, the present invention envisages a white light emitting device comprising: an excitation source with a dominant emission wavelength within a range from 200 nm to 480 nm; a coated phosphor as described herein, with a first phosphor peak emission wavelength; and a second phosphor with a second phosphor peak emission wavelength different to said first phosphor peak wavelength.

In some embodiments, the coated phosphor may absorb radiation at a wavelength of 450 nm and emits light with a photoluminescence peak emission wavelength between about 530 nm and about 545 nm; and said second phosphor emits light with a photoluminescence peak emission wavelength between about 600 nm and about 650 nm. Such white light emitting devices may find applications for display backlighting applications and general lighting.

For backlighting applications, the excitation source may have a dominant emission wavelength within a range from 440 nm to 480 nm; and the white light emitting device may have an emission spectrum with clearly separated blue, green and red peaks, and a color gamut after LCD RGB color filters of at least 85% of NTSC.

In yet another aspect of the present invention, there is provided a white light emitting device for backlighting, comprising: an excitation source with a dominant emission wavelength within a range from 440 nm to 480 nm; a coated phosphor as described herein with a first phosphor peak emission wavelength between about 530 nm and about 545 nm; and a second phosphor with a second phosphor peak emission wavelength different to said first phosphor peak wavelength, said second phosphor peak emission wavelength being between about 600 nm and about 650 nm; wherein said white light emission device has an emission spectrum with clearly separated blue, green and red peaks, and a color gamut after LCD RGB color filters of at least 85% of NTSC.

It various white light emitting devices, it may be that at least one of the coated phosphor and second phosphor is located in a remote phosphor component. For example, in some embodiments, the coated phosphor may be located in the remote phosphor component and the second phosphor may be located in a package housing the excitation source. It may be that, for example, the remote phosphor component comprises a film such as "on-film" that is applied to the rear surface of the display.

In yet further embodiments, the narrow band green phosphor can further comprise elements M' and A'; where M' comprises for example Li, Na and K; and A' comprises for example Si, Ge and Ti.

In some such embodiments, the present invention contemplates a coated phosphor comprising phosphor particles comprised of a phosphor material with composition (M,M') $(A,A')_2S_4$:Eu, wherein: M is at least one of Mg, Ca, Sr and Ba; M' is at least one of Li, Na and K; A is at least one of Ga, Al, In, La and Y; A' is at least one of Si, Ge and Ti; and a dense impermeable coating of an oxide material encapsulating individual ones of said phosphor particles; and wherein said coated phosphor is configured to satisfy at least one of the conditions: (1) under excitation by blue light, the reduction in photoluminescent intensity at the peak emission wavelength after 1,000 hours of aging at about 85° C. and about 85% relative humidity is no greater than about 30%; (2) the change in chromaticity coordinates CIE(y), ΔCIE y, after 1,000 hours of aging at about 85° C. and about 85% relative humidity is less than about $5\times10^{-3}$; (3) said coated phosphor does not turn black when suspended in a 1 mol/L silver nitrate solution for at least two hours at 85° C.; (4) said coated phosphor does not turn black when suspended in a 1 mol/L silver nitrate solution for at least one day at 20° C.; and (5) said coated phosphor does not turn black when suspended in a 1 mol/L silver nitrate solution for at least 5 days at 20° C. In such phosphor materials, it is believed that M' substitutes for M, and A' substitutes for A in the $MA_2S_4$ crystalline lattice.

In another aspect, the present invention envisages a coated phosphor comprising phosphor particles comprised of a phosphor material with composition $(M)(A)_2S_4$:Eu, M', A' wherein: M is at least one of Mg, Ca, Sr and Ba; M' is at least one of Li, Na and K; A is at least one of Ga, Al, and In; and A' is at least one of Si, Ge, La, Y and Ti; and a dense impermeable coating of an oxide material encapsulating individual ones of said phosphor particles; and wherein said coated phosphor is configured to satisfy at least one of the conditions: (1) under excitation by blue light, the reduction in photoluminescent intensity at the peak emission wavelength after 1,000 hours of aging at about 85° C. and about 85% relative humidity is no greater than about 30%; (2) the change in chromaticity coordinates CIE(y), ΔCIE y, after 1,000 hours of aging at about 85° C. and about 85% relative humidity is less than about $5\times10^{-3}$; (3) said coated phosphor does not turn black when suspended in a 1 mol/L silver nitrate solution for at least two hours at 85° C.; (4) said coated phosphor does not turn black when suspended in a 1 mol/L silver nitrate solution for at least one day at 20° C.; and (5) said coated phosphor does not turn black when suspended in a 1 mol/L silver nitrate solution for at least 5 days at 20° C.

The coated phosphor may be configured such that the change in chromaticity coordinates CIE(y), ΔCIE y, after 1,000 hours of aging at about 85° C. and about 85% relative humidity is less than or equal to about $3\times10^{-3}$.

The oxide may be one or more materials chosen from the group comprising aluminum oxide, silicon oxide, titanium oxide, zinc oxide, magnesium oxide, zirconium oxide and chromium oxide.

In some embodiments, the oxide material may be alumina.

The coating may have a thickness in the range of 100 nm to 5 μm or in the range of 800 nm to 1.2 μm.

The phosphor particles may have a size distribution having a $D_{50}$ value within the range of 5 μm to 15 μm.

In some embodiments, M may be Sr.

In some embodiments, A may be Ga.

In some embodiments, A may be Ga, M may be Sr and said oxide material may be alumina.

The coated phosphor may have a peak photoluminescence between 535 nm and 537 nm and a FWHM of between 48 nm and 50 nm, when excited by blue light with a peak emission of about 450 nm.

In a further aspect of the present invention, there is provided a phosphor comprising phosphor particles comprised of a phosphor material with composition—$(M_{1-x}Li_x)$ $(A_{1-x/2}Si_{x/2})_2S_4$:Eu, wherein: M is at least one of Mg, Ca, Sr and Ba; and A is at least one of Ga, Al, In, La and Y; wherein $0<x<0.1$. The phosphor may further comprise a dense impermeable coating of an oxide material encapsulating individual ones of said phosphor particles. The phosphor may have a coating have a thickness in the range of 100 nm to 5 µm or in the range of 800 nm to 1.2 µm. The phosphor particles may be characterized by a size distribution having a $D_{50}$ value within the range of 5 µm to 15 µm. The oxide material may be one or more materials chosen from the group comprising aluminum oxide, silicon oxide, titanium oxide, zinc oxide, magnesium oxide, zirconium oxide and chromium oxide. The oxide material may be alumina. In some embodiments, M may be Sr and A may be Ga. The phosphor phosphor may have a peak photoluminescence between 535 nm and 537 nm and a FWHM of between 48 nm and 50 nm, when excited by a blue light source with a dominant emission wavelength of about 450 nm.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

Figure 21:
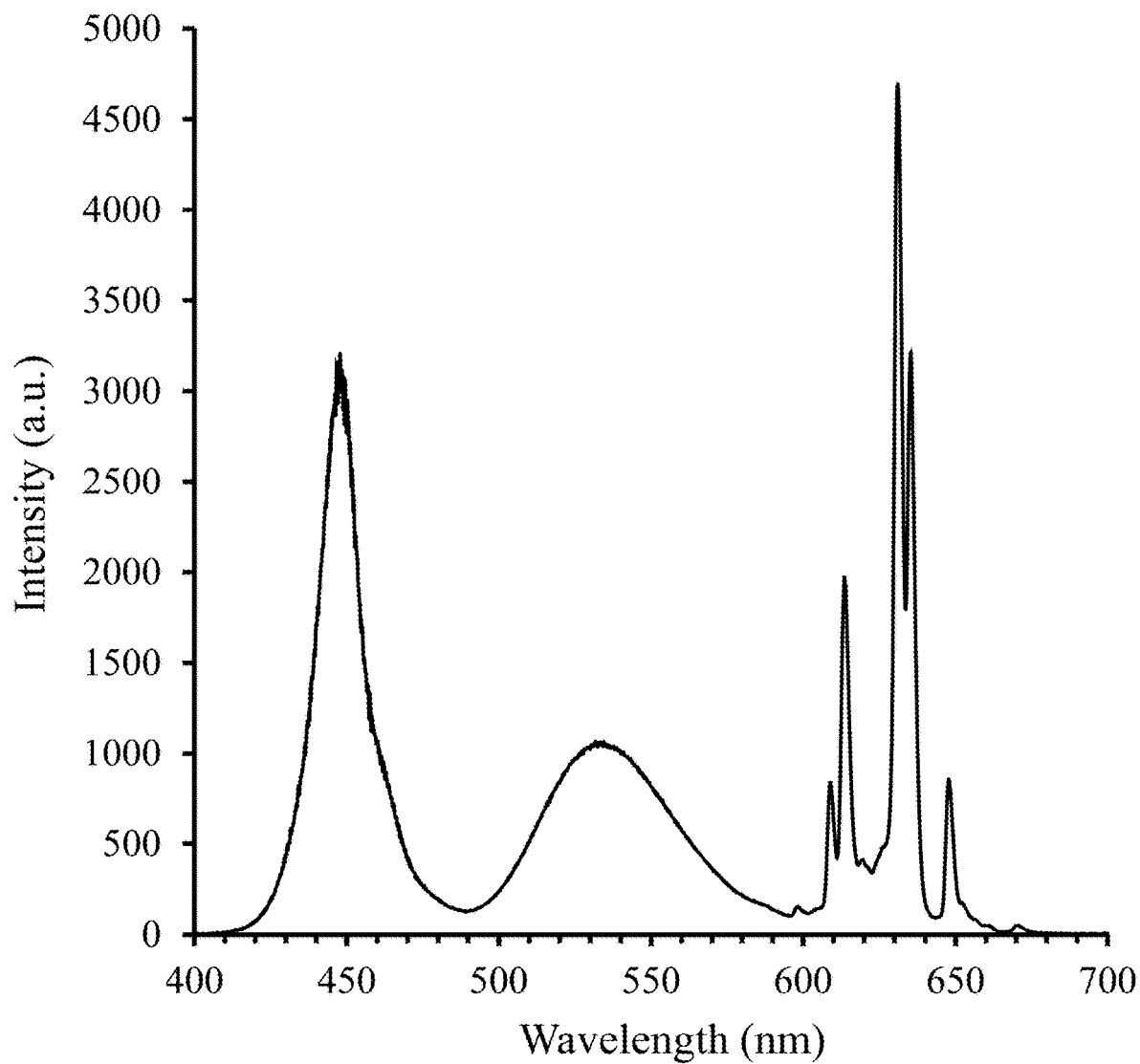
FIG. 21 shows a white light emission spectra of a white light emitting device comprising alumina coated NBG (537 nm) phosphor and KSF red phosphor, according to some embodiments of the invention.
Figure 22:
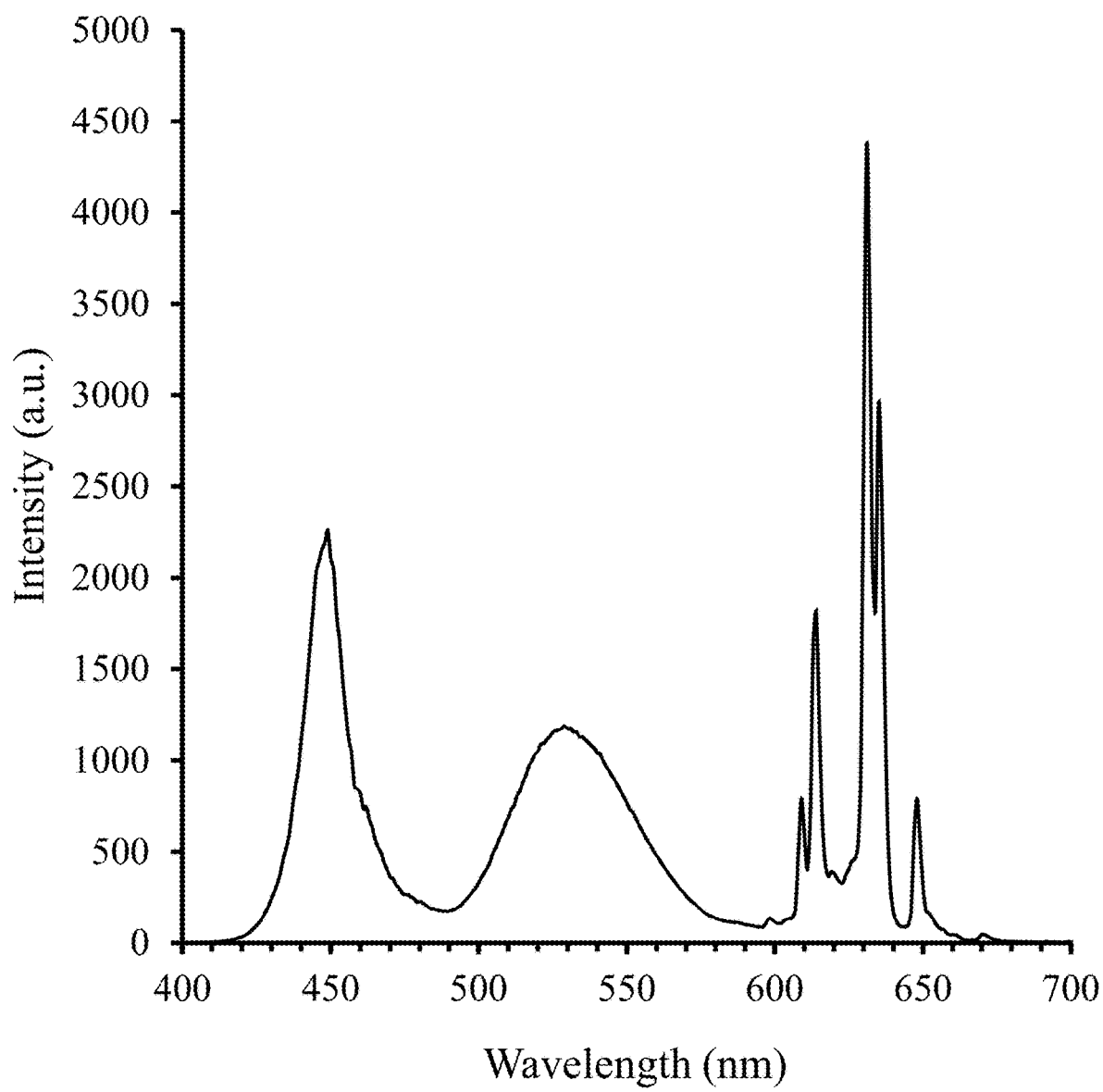
Figure 23:
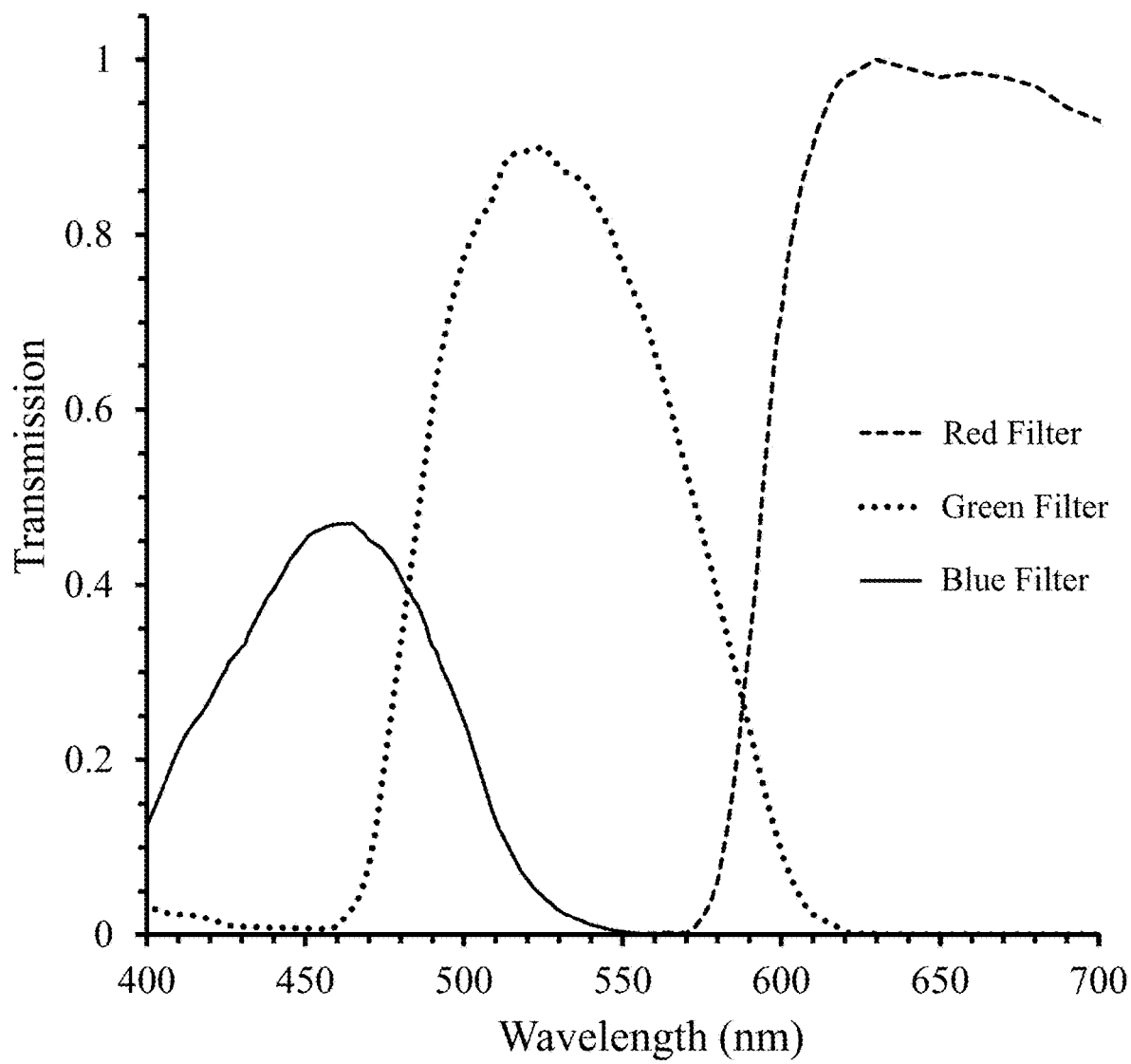
Figure 24:
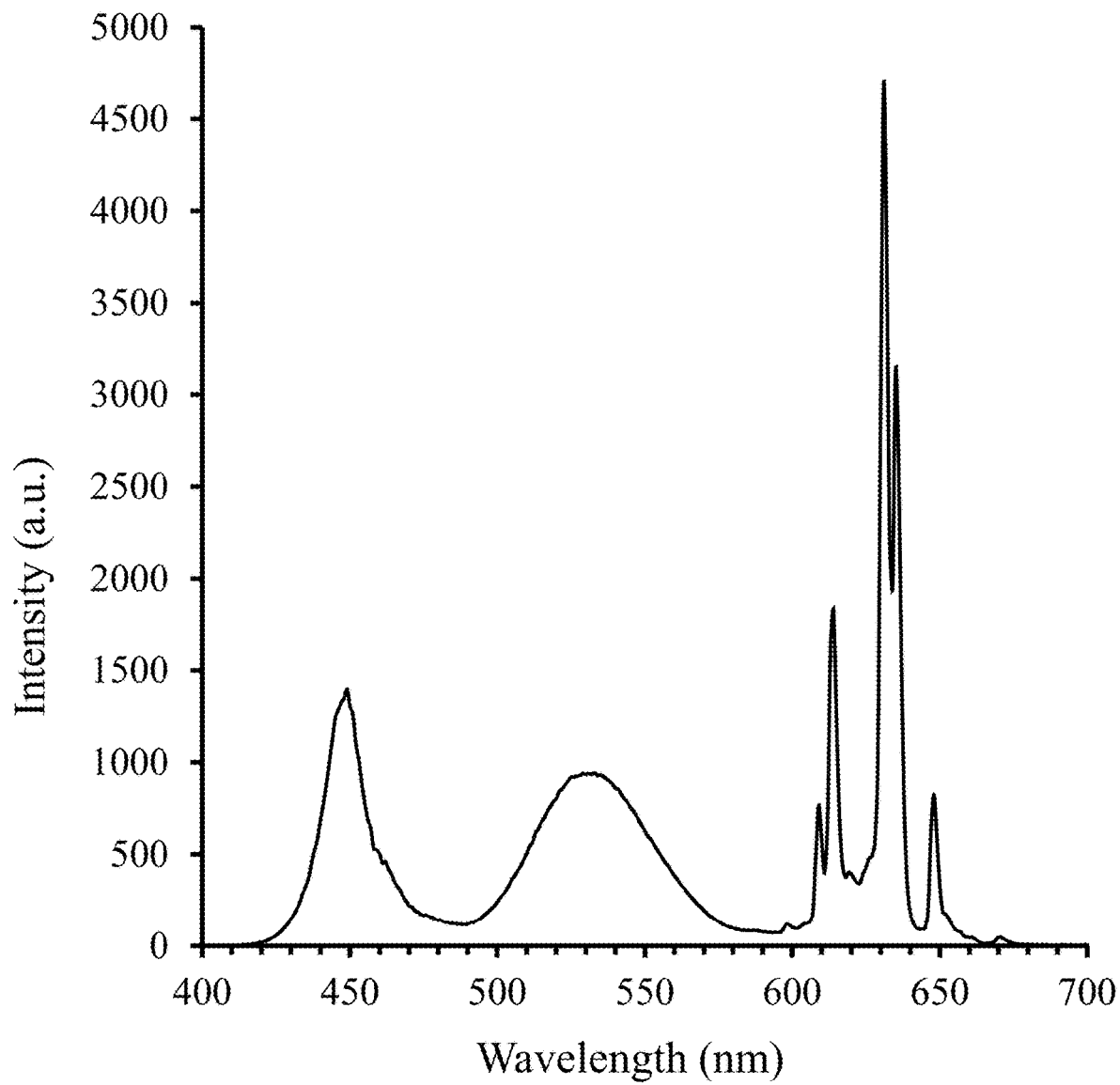
Figure 25:
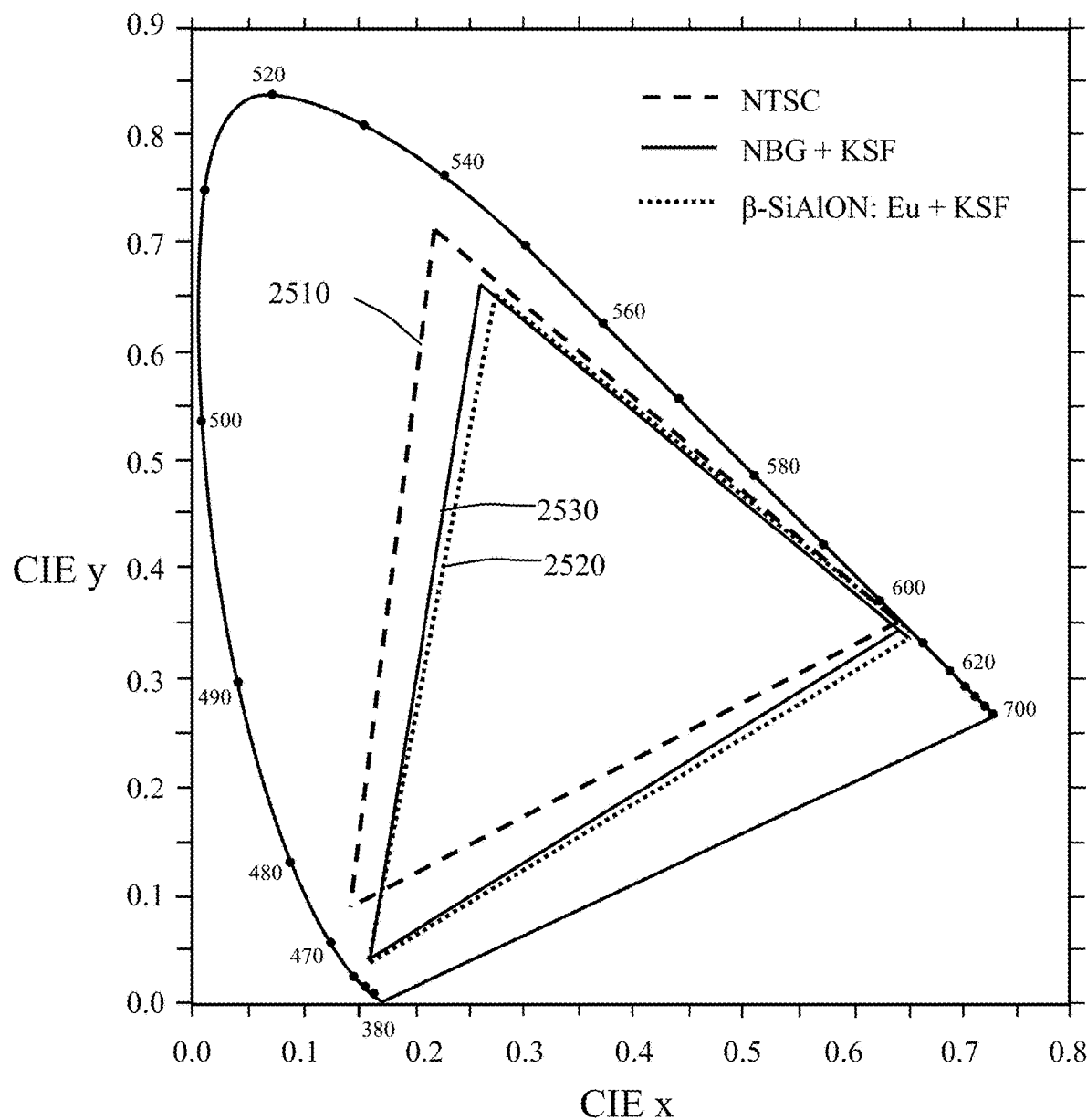
Figure 26A:
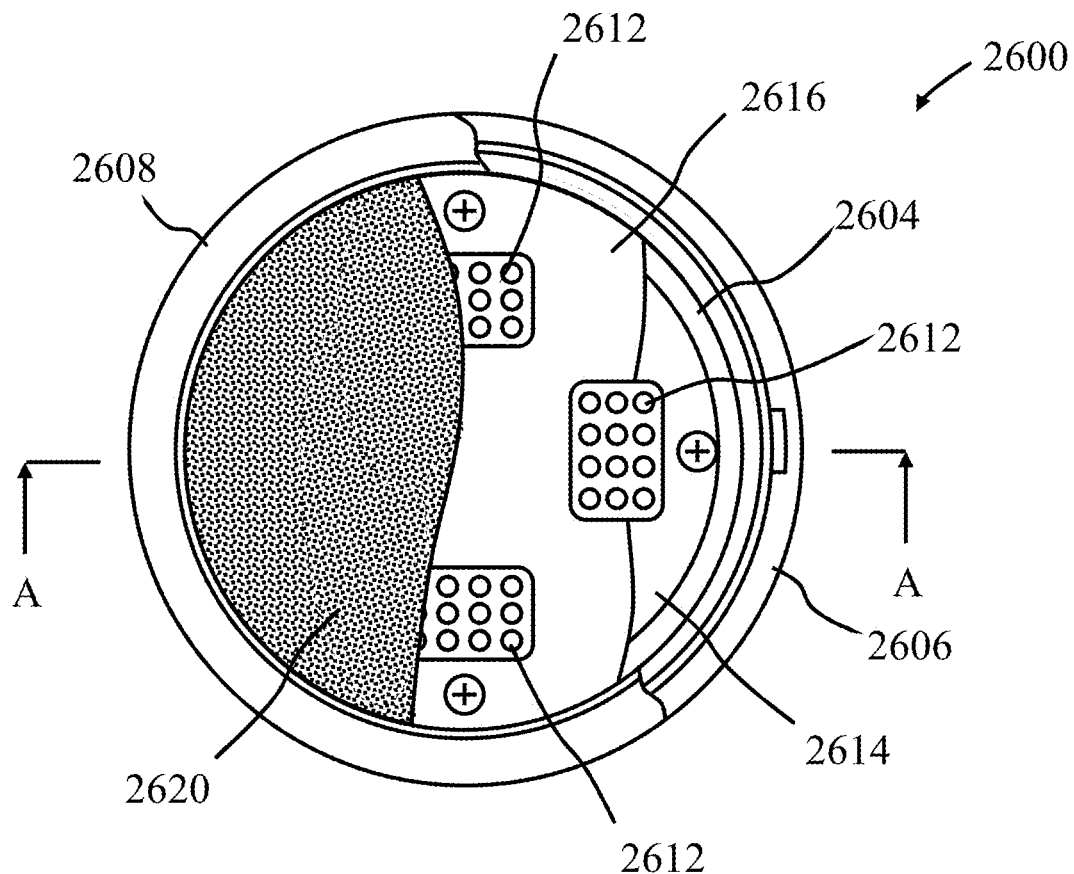
Figure 26B:
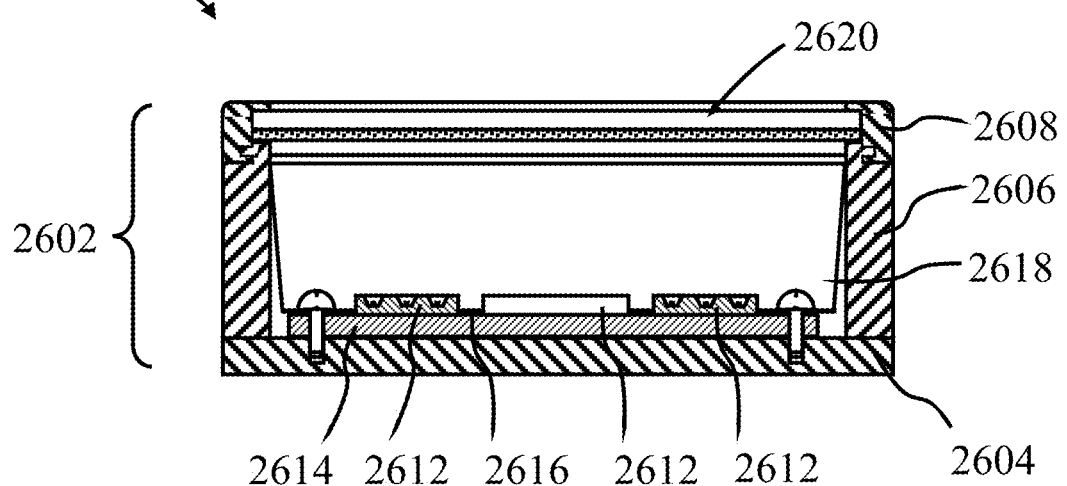

FIG. 22 shows a white light emission spectra of a white light emitting device comprising alumina coated NBG (537 nm) phosphor and KSF red phosphor, according to some embodiments of the invention, after filtering by the red, green and blue filter elements (Hisense);

FIG. 23 shows the filtering characteristics, light transmission versus wavelength, for red, green and blue filter elements (AUO) of an LCD display;

FIG. 24 shows a white light emission spectra of a white light emitting device comprising alumina coated NBG (537 nm) phosphor and KSF red phosphor, according to some embodiments, after filtering by the red, green and blue filter elements (AUO) of an LCD display;

FIG. 25 shows the 1931 CIE color coordinates of the NTSC standard and the calculated RGB color coordinates from the white light source for which a spectrum is shown in FIG. 21, according to some embodiments of the invention; and FIGS. 26A & 26B show a cut-away top view and a cross-sectional view, respectively, of a white light remote phosphor solid-state light emitting device, according to some embodiments of the invention.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Embodiments of the present invention are directed generally to narrow band green and coated narrow band green phosphors with general composition based on $MA_2S_4$:Eu, wherein: M is at least one of Mg, Ca, Sr and Ba, A is at least one of Ga, Al, In, La and Y, and the coating is one or more oxides chosen from the group of materials comprising aluminum oxide, silicon oxide, titanium oxide, zinc oxide, magnesium oxide, zirconium oxide and chromium oxide. For example, a narrow band green phosphor may have a composition (M)(A)$_2S_4$:Eu, M', A' wherein: M is at least one of Mg, Ca, Sr and Ba; M' is at least one of Li, Na and K; A is at least one of Ga, Al, and In; and A' is at least one of Si, Ge, La, Y and Ti. In the latter formula the dopants Eu, M' and A' may be present in substitutional sites, although other options for incorporation are envisaged, such as interstitial sites. Furthermore, a narrow band green phosphor may have a composition (M,M')(A,A')$_2S_4$:Eu, wherein: M is at least one of Mg, Ca, Sr and Ba; M' is at least one of Li, Na and K; A is at least one of Ga, Al, In, La and Y; and A' is at least one of Si, Ge and Ti; wherein M' substitutes for M, and A' substitutes for A in the $MA_2S_4$ crystalline lattice. In the latter formula the specific substitution sites are identified, although it is envisaged that alternative substitutional sites may exist; for example, the inventors envisage that for doping with Li and Si the following structure may provide an alternative substitutional site for the Li:Sr(Ga$_{1-2x}$Si$_x$Li$_{2x}$)$_2$S$_4$:Eu, wherein: M is at least one of Mg, Ca, Sr and Ba; and A is at least one of Ga, Al, In, La and Y; wherein 0<x<0.1

Phosphor Synthesis

Synthesis of a doped SrGa$_2$S$_4$:Eu phosphor was by one of the following processes.

In a first process, Ga$_2$S$_3$ material was synthesized by exposing a Ga$_2$O$_3$ precursor to CS$_2$ in a N$_2$ atmosphere, at 900° C. for 6 hours. In order to synthesize Li and Si doped Eu$_{0.05}$Sr$_{0.95}$Ga$_2$S$_4$ phosphor, EuCl$_3$, SrCO$_3$, Ga$_2$S$_3$, SiO$_2$ and Li$_2$CO$_3$ powders were weighed with molar ratio of 0.05, 0.95, 1.0, 0.1 and 0.1. The powders were mixed using a mortar and pestle, and placed in an alumina crucible and calcined in a box-type furnace at 850° C. for 4 hours followed by a further 2 hours at 900° C. exposed to a N$_2$ gas stream carrying CS$_2$. The resulting sintered phosphor cake was removed from the furnace and mortared, washed, and sieved prior to evaluation. This first process was used to synthesize the uncoated phosphors described in Tables 1-16.

In a second process, which is particularly suitable for larger scale synthesis of SrGa$_2$S$_4$:Eu, Pr phosphor for coating in a fluidized bed chemical vapor deposition reactor, a Ga$_2$O$_3$—SrSO$_4$—Eu$_2$O$_3$—Pr$_2$O$_3$ precursor is prepared as follows. 40 g of gallium metal was dissolved in 250 ml of concentrated nitric acid (70% HNO$_3$) in a 1 liter flask (approximately 4 days at room temperature) to form Ga(NO$_3$)$_3$ solution. Then 1.4 g Eu$_2$O$_3$ and 0.007 g Pr$_6$O$_{11}$ were dissolved in the acidic Ga(NO$_3$)$_3$ solution, and the Ga(NO$_3$)$_3$—Eu(NO$_3$)$_3$—Pr(NO$_3$)$_3$ solution was transferred into a 3 liter glass beaker. 30 g of powder (5-15 micron particle size) of SrSO$_4$ or SrCO$_3$ was dispersed in the nitrate solution while stirring, and the solution was stirred for 1 hour at room temperature. The pH of the solution was slowly adjusted to pH 7.0 by adding NH$_4$OH (5.0 wt %), resulting in precipitation of phosphor particles. After the precipitates settled, the phosphor particles were filtered out and dried. Note that the above process may also be used to form the NBG phosphor with only one activator—Eu—if desired; furthermore, if Pr co-activator is used it will typically be incorporated in amounts in the range of 0<Pr<0.15 molar percent of Eu. This second process was used to synthesize the phosphors which were then coated in a fluidized bed chemical vapor deposition reactor as described below; data for these phosphors is provided in Tables 17-21.

The first and second processes were also used to make NBG phosphors (SrGa$_2$S$_4$:Eu and related materials, as described herein) including various dopants and/or substituted elements, as will be clear from Tables 1-6 below.

TABLE 1

Starting materials for manufacturing Li/Si doped SrGa$_2$S$_4$:Eu (5% Eu)

| Composition | EuCl$_3$ (mole) | SrS (mole) | Ga$_2$S$_3$ (mole) | SiO$_2$ (mole) | Li$_2$CO$_3$ (mole) | Al$_2$O$_3$ (mole) |
|---|---|---|---|---|---|---|
| SrGa$_2$S$_4$:Eu | 0.05 | 0.95 | 1.00 | — | — | — |
| SrGa$_2$S$_4$:Eu (5% Si) | 0.05 | 0.95 | 1.00 | 0.10 | — | — |
| SrGa$_2$S$_4$:Eu (Li/2.5% Si) | 0.05 | 0.95 | 1.00 | 0.05 | 0.05 | — |
| SrGa$_2$S$_4$:Eu (Li/5% Si) | 0.05 | 0.95 | 1.00 | 0.10 | 0.10 | — |
| SrGa$_2$S$_4$:Eu (Li/7.5% Si) | 0.05 | 0.95 | 1.00 | 0.15 | 0.15 | — |
| SrGa$_2$S$_4$:Eu (Li/10% Si) | 0.05 | 0.95 | 1.00 | 0.20 | 0.20 | — |
| SrGa$_2$S$_4$:Eu (Li/5% Si, 2.5% Al) | 0.05 | 0.95 | 1.00 | 0.10 | 0.10 | 0.025 |
| SrGa$_2$S$_4$:Eu (Li/5% Si, 5% Al) | 0.05 | 0.95 | 1.00 | 0.10 | 0.10 | 0.050 |
| SrGa$_2$S$_4$:Eu (Li/5% Si, 10% Al) | 0.05 | 0.95 | 1.00 | 0.10 | 0.10 | 0.100 |

TABLE 2

Starting materials for manufacturing In, Li/Si and Li, Y doped SrGa$_2$S$_4$:Eu (5% Eu)

| Composition | EuCl$_3$ (mole) | SrS (mole) | Ga$_2$S$_3$ (mole) | SiO$_2$ (mole) | Li$_2$CO$_3$ (mole) | In$_2$O$_3$ (mole) | Y$_2$O$_3$ (mole) |
|---|---|---|---|---|---|---|---|
| SrGa$_2$S$_4$:Eu (2.5% In, Li/2.5%) | 0.05 | 0.95 | 0.97 | 0.05 | 0.05 | 0.025 | — |
| SrGa$_2$S$_4$:Eu (5% Li, 5% Y) | 0.05 | 0.95 | 0.95 | — | 0.1 | — | 0.05 |

TABLE 3

Starting materials for manufacturing Li/5% Si doped SrGa$_2$S$_4$:Eu with differing Eu concentrations

| Composition | EuCl$_3$ (mole) | SrS (mole) | Ga$_2$S$_3$ (mole) | SiO$_2$ (mole) | Li$_2$CO$_3$ (mole) |
|---|---|---|---|---|---|
| SrGa$_2$S$_4$:Eu (1% Eu, Li/5% Si) | 0.01 | 0.95 | 1.00 | 0.10 | 0.10 |
| SrGa$_2$S$_4$:Eu (2% Eu, Li/5% Si) | 0.02 | 0.95 | 1.00 | 0.10 | 0.10 |
| SrGa$_2$S$_4$:Eu (3% Eu, Li/5% Si) | 0.03 | 0.95 | 1.00 | 0.10 | 0.10 |
| SrGa$_2$S$_4$:Eu (4% Eu, Li/5% Si) | 0.04 | 0.95 | 1.00 | 0.10 | 0.10 |
| SrGa$_2$S$_4$:Eu (5% Eu, Li/5% Si) | 0.05 | 0.95 | 1.00 | 0.10 | 0.10 |

TABLE 4

Starting materials for manufacturing Na/Si doped SrGa$_2$S$_4$:Eu (5% Eu)

| Composition | EuCl$_3$ (mole) | SrS (mole) | Ga$_2$S$_3$ (mole) | SiO$_2$ (mole) | Na$_2$CO$_3$ (mole) | Al$_2$O$_3$ (mole) |
|---|---|---|---|---|---|---|
| SrGa$_2$S$_4$:Eu (Na/5% Si) | 0.05 | 0.95 | 1.00 | 0.10 | 0.10 | — |

TABLE 5

Starting materials for manufacturing Ca and Ba doped SrGa$_2$S$_4$:Eu

| Composition | EuCl$_3$ (mole) | SrS (mole) | Ga$_2$S$_3$ (mole) | CaS (mole) | BaS (mole) | Al$_2$O$_3$ (mole) |
|---|---|---|---|---|---|---|
| SrGa$_2$S$_4$:Eu (5% Eu, 2% Ca) | 0.05 | 0.93 | 1.00 | 0.02 | — | — |
| SrGa$_2$S$_4$:Eu (5% Eu, 2% Ca, 5% Al) | 0.05 | 0.93 | 0.95 | 0.02 | — | 0.05 |
| SrGa$_2$S$_4$:Eu (1% Eu, 2% Ca, 10% Al) | 0.01 | 0.93 | 0.90 | 0.02 | — | 0.10 |
| SrGa$_2$S$_4$:Eu (2% Eu, 2% Ca, 10% Al) | 0.02 | 0.93 | 0.90 | 0.02 | — | 0.10 |
| SrGa$_2$S$_4$:Eu (3% Eu, 2% Ca, 10% Al) | 0.03 | 0.93 | 0.90 | 0.02 | — | 0.10 |
| SrGa$_2$S$_4$:Eu (4% Eu, 2% Ca, 10% Al) | 0.04 | 0.93 | 0.90 | 0.02 | — | 0.10 |
| SrGa$_2$S$_4$:Eu (5% Eu, 2% Ca, 10% Al) | 0.05 | 0.93 | 0.90 | 0.02 | — | 0.10 |
| SrGa$_2$S$_4$:Eu (4% Ca, 2% Ba) | 0.05 | 0.89 | 1.00 | 0.04 | 0.02 | — |
| SrGa$_2$S$_4$:Eu (2% Ba) | 0.05 | 0.93 | 1.00 | — | 0.02 | — |

TABLE 6

Starting materials for manufacturing In, La, Y and Al doped SrGa$_2$S$_4$:Eu (5% Eu)

| Composition | EuCl$_3$ (mole) | SrS (mole) | Ga$_2$S$_3$ (mole) | In$_2$S$_3$ (mole) | La$_2$O$_3$ (mole) | Y$_2$O$_3$ (mole) | Al$_2$O$_3$ (mole) |
|---|---|---|---|---|---|---|---|
| SrGa$_2$S$_4$:Eu (2.5% In) | 0.05 | 0.95 | 0.975 | 0.025 | — | — | — |
| SrGa$_2$S$_4$:Eu (5% In) | 0.05 | 0.95 | 0.95 | 0.05 | — | — | — |
| SrGa$_2$S$_4$:Eu (10% In) | 0.05 | 0.95 | 0.90 | 0.10 | — | — | — |
| SrGa$_2$S$_4$:Eu (5% La) | 0.05 | 0.95 | 0.95 | — | 0.05 | — | — |
| SrGa$_2$S$_4$:Eu (5% Y) | 0.05 | 0.95 | 0.95 | — | — | 0.05 | — |

Phosphor Characterization

Figure 1:
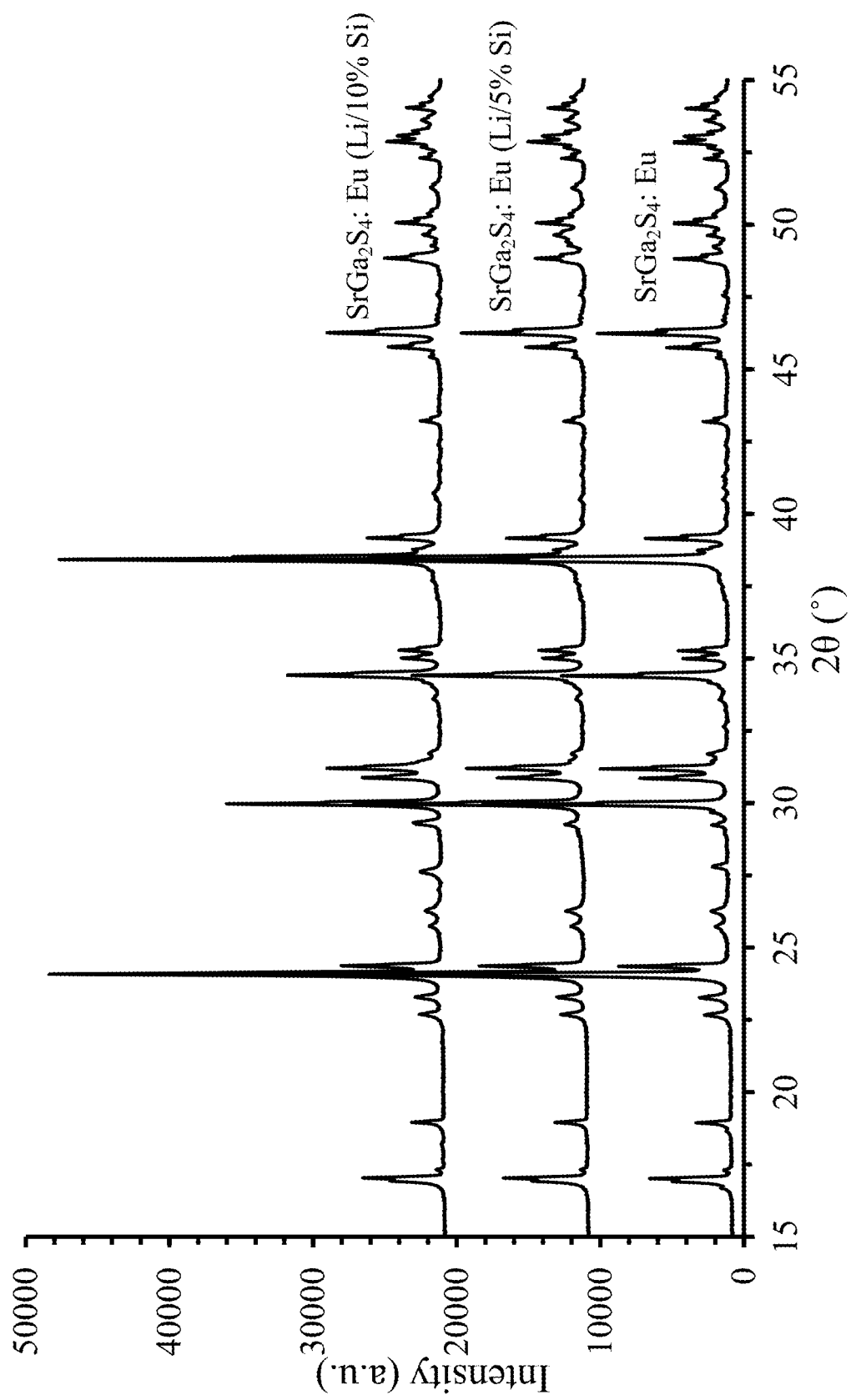
FIGS. 1 & 2 shows XRD data for NBG ($SrGa_2S_4$:Eu) phosphor and Li/Si doped NBG phosphor, according to some embodiments of the invention.
Figure 2:
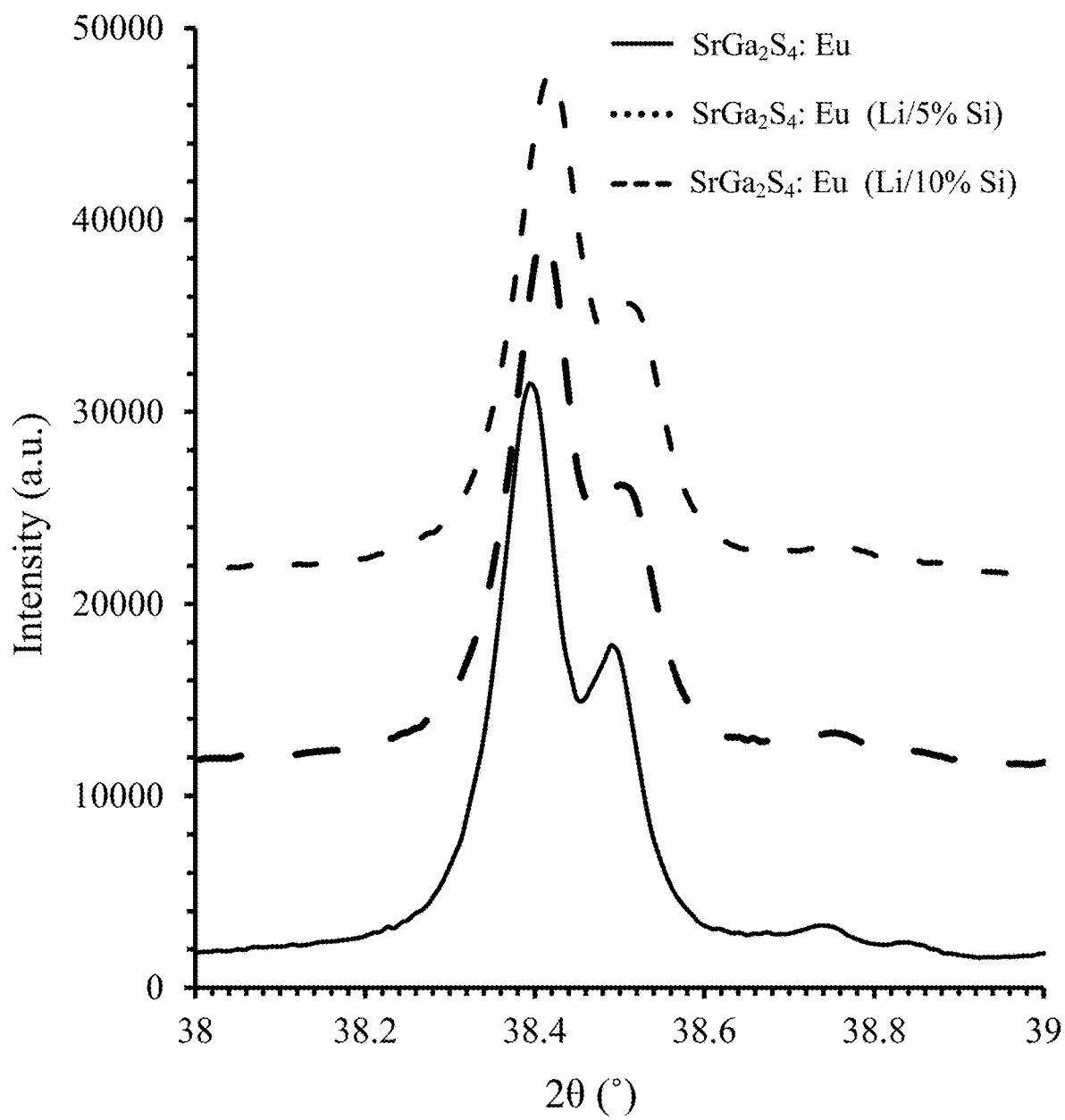

FIGS. 1 & 2 shows X-ray diffraction (XRD) data for SrGa$_2$S$_4$:Eu phosphor, referred to herein as NBG, and lithium, silicon co-doped NBG phosphor, according to some embodiments of the invention. The XRD patterns of the phosphors were measured using the Kα line of a Copper target. Data is shown for (1) NBG, (2) NBG plus lithium and 5 percent (%) silicon, and (3) NBG plus lithium and 10 percent silicon. (Here the percentages are derived from dividing the moles of silicon by the moles of gallium. The amount of lithium in the phosphor is unknown, but clearly will not exceed the amount of starting material, and is assumed to provide charge balance for the silicon dopant.) It is noted that the diffraction peaks are shifted only very slightly to larger angles with increase of dopant concentration from 0 percent, to 5 percent, to 10 percent—the three samples exhibit the same crystalline structure, with the shift to larger angle being consistent with Si being present in the SrGa$_2$S$_4$ crystal lattice as a dopant.

The NBG and doped NBG phosphor particles (powder) were tested using an Ocean Optics USB4000 spectrometer for photoluminescence intensity (PL) and chromaticity (CIE coordinates x and y). The results are summarized in Table 7 for a range of different lithium and silicon dopant concentrations. In the Table, PE is the wavelength at the peak of the photoluminescence curve, PL is the relative intensity of the photoluminescence peak, and FWHM is the full width at half maximum for the photoluminescence peaks. The powder test method involves placing the phosphor powder on a stage, illuminating the phosphor powder with blue light and measuring the emitted light; software is used to remove the blue light from the measurement to provide a measure of the photoluminescence.

TABLE 7

Optical Properties of Li/Si doped SrGa$_2$S$_4$:Eu (5% Eu) - Powder Test

| Material | PE (nm) | PL | CIE x | CIE y | FWHM (nm) |
|---|---|---|---|---|---|
| SrGa$_2$S$_4$:Eu | 536.0 | 0.91 | 0.2818 | 0.6799 | 49.2 |
| SrGa$_2$S$_4$:Eu (Li/2.5% Si) | 535.7 | 0.93 | 0.2804 | 0.6810 | 49.5 |
| SrGa$_2$S$_4$:Eu (Li/5% Si) | 535.9 | 1.00 | 0.2811 | 0.6821 | 49.1 |
| SrGa$_2$S$_4$:Eu (Li/7.5% Si) | 536.2 | 1.04 | 0.2833 | 0.6809 | 48.8 |
| SrGa$_2$S$_4$:Eu (Li/10% Si) | 536.4 | 0.97 | 0.2847 | 0.6799 | 48.6 |

The NBG control sample and one of the Li/Si doped NBG samples were tested using a cavity test, and brightness, CIE x and CIE y were measured and quantum efficiency (QE) was calculated—results are provided in Table 8. The cavity test is similar to the powder test described above, except the phosphor powder is mixed with an uncurable encapsulant and placed in a cavity for testing, instead of the powder being placed on a stage, total emission is measured in an integrating sphere, and the brightness includes blue light.

TABLE 8

Optical Properties of SrGa$_2$S$_4$:Eu (5% Eu) and Li/5% Si doped SrGa$_2$S$_4$:Eu (5% Eu) (LED 459.6 nm) - Cavity Test

| Material | Brightness (%) | CIE x | CIE y | QE |
|---|---|---|---|---|
| SrGa$_2$S$_4$:Eu | 100 | 0.2070 | 0.3328 | 0.71 |
| SrGa$_2$S$_4$:Eu (Li/5% Si) | 105 | 0.2074 | 0.3417 | 0.75 |

Figure 3:
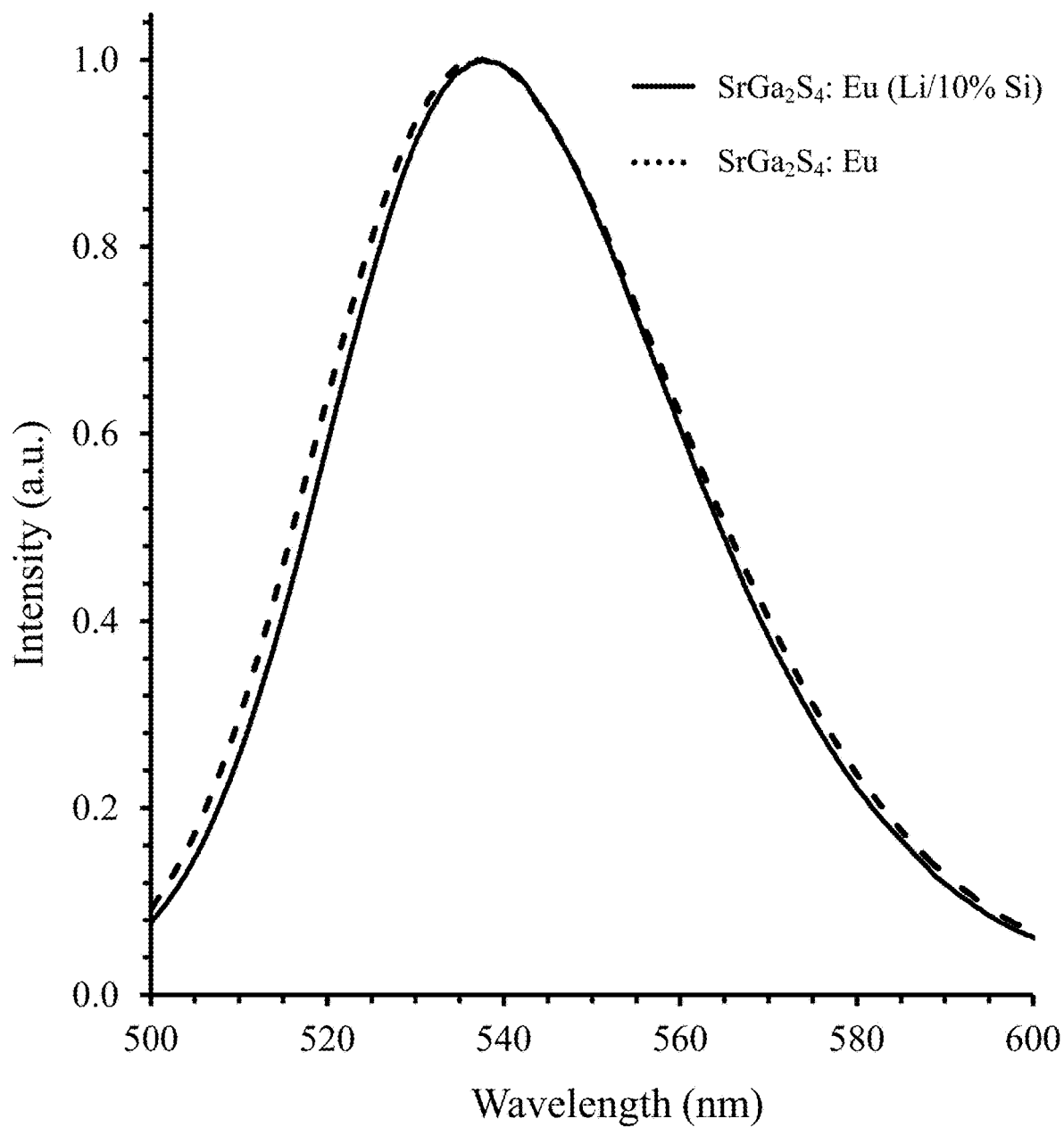
FIG. 3 shows normalized emission spectra for NBG phosphor and Li/10% Si doped NBG phosphor, according to some embodiments of the invention.

Table 9 provides powder test data for NBG phosphor and lithium, 10 percent silicon co-doped NBG phosphor, according to some embodiments of the invention. FIG. 3 shows normalized emission spectra for the same samples. Table 7 and FIG. 3 show that there is a trend to narrower FWHM for the photoluminescence peaks with increasing lithium and silicon dopant concentration over the tested range, although the peak photoluminescence intensity appears to reach a maximum at around lithium/7.5% silicon.

TABLE 9

Optical Properties of SrGa$_2$S$_4$:Eu (5% Eu) and Li/10% Si doped SrGa$_2$S$_4$:Eu (5% Eu) - Powder Test

| Material | PE (nm) | PL | CIE x | CIE y | FWHM (nm) |
|---|---|---|---|---|---|
| SrGa$_2$S$_4$:Eu | 537.4 | 1.62 | 0.2931 | 0.6760 | 49.1 |
| SrGa$_2$S$_4$:Eu (Li/10% Si) | 538.4 | 1.96 | 0.2937 | 0.6771 | 47.0 |

Tables 10, 11 & 12 provide powder test data and cavity test data for NBG phosphor doped with varying amounts of one or more of Ca, Ba, Li, In, and Si. The data shows the emission characteristics can be varied by using these dopants. Furthermore, the Li/Si doped NBG phosphor showed an improvement over the un-doped NBG of the thermal properties of the phosphor as measured by the PL (Photoluminance) at 100° C. as a percentage of PL at room temperature, and the best thermal properties when compared with the other doped samples.

TABLE 10

Optical Properties of Ca doped, Ba doped, Ca/Ba doped and Li/Si doped SrGa$_2$S$_4$:Eu (5% Eu) - Powder Test

| Material | PE (nm) | PL @ 25° C. | CIE x | CIE y | FWHM (nm) | % PL @100° C. |
|---|---|---|---|---|---|---|
| SrGa$_2$S$_4$:Eu | 535.9 | 0.97 | 0.2819 | 0.6813 | 49.0 | 85.9 |
|  | 535.9 | 0.97 | 0.2815 | 0.6807 | 49.2 | 86.7 |
|  | 535.9 | 1.00 | 0.2815 | 0.6811 | 49.2 | 86.7 |
|  | 535.9 | 0.98 | 0.2816 | 0.6810 | 49.1 | 86.4 |
| SrGa$_2$S$_4$:Eu (2% Ca) | 537.1 | 1.06 | 0.2879 | 0.6790 | 48.4 | 85.3 |
|  | 537.1 | 1.04 | 0.2870 | 0.6793 | 48.6 | 84.6 |
|  | 537.0 | 1.09 | 0.2869 | 0.6791 | 48.7 | 86.6 |
|  | 537.1 | 1.06 | 0.2873 | 0.6791 | 48.6 | 85.5 |
| SrGa$_2$S$_4$:Eu (2% Ba) | 536.3 | 1.01 | 0.2820 | 0.6821 | 48.5 | 84.4 |
|  | 535.9 | 1.07 | 0.2813 | 0.6826 | 48.6 | 86.0 |
|  | 535.6 | 1.01 | 0.2799 | 0.6823 | 49.0 | 86.9 |
|  | 535.6 | 1.03 | 0.2811 | 0.6823 | 48.7 | 85.8 |
| SrGa$_2$S$_4$:Eu (4% Ca, 2% Ba) | 537.0 | 1.06 | 0.2886 | 0.6777 | 48.9 | 84.8 |
|  | 537.0 | 1.00 | 0.2884 | 0.6766 | 49.2 | 85.5 |
|  | 537.0 | 1.08 | 0.2882 | 0.6777 | 49.0 | 87.3 |
|  | 537.0 | 1.05 | 0.2884 | 0.6773 | 49.0 | 85.9 |
| SrGa$_2$S$_4$:Eu (Li/5% Si) | 536.2 | 1.07 | 0.2832 | 0.6796 | 49.0 | 88.1 |
|  | 536.4 | 1.08 | 0.2850 | 0.6798 | 48.7 | 87.5 |
|  | 536.6 | 1.16 | 0.2859 | 0.6791 | 48.5 | 87.6 |
|  | 536.4 | 1.10 | 0.2847 | 0.6795 | 48.7 | 87.7 |

TABLE 11

Optical Properties of In doped, Li/Si doped and In, Li/Si doped SrGa$_2$S$_4$:Eu (5% Eu) - Powder Test

| Material | PE (nm) | PL @ 25° C. | CIE x | CIE y | FWHM (nm) | % PL @100° C. |
|---|---|---|---|---|---|---|
| SrGa$_2$S$_4$:Eu | 535.7 | 0.68 | 0.2809 | 0.6810 | 49.2 |  |
| SrGa$_2$S$_4$:Eu (2.5% In) | 536.6 | 0.88 | 0.2836 | 0.6813 | 48.5 | 76.8 |
| SrGa$_2$S$_4$:Eu (5% In) | 536.5 | 0.89 | 0.2831 | 0.6814 | 48.6 | 73.8 |
| SrGa$_2$S$_4$:Eu (10% In) | 535.5 | 0.60 | 0.2802 | 0.6806 | 48.7 | 67.8 |
| SrGa$_2$S$_4$:Eu (Li/2.5% Si) | 536.2 | 1.05 | 0.2814 | 0.6827 | 48.6 |  |
| SrGa$_2$S$_4$:Eu (Li/5% Si) | 536.8 | 1.10 | 0.2848 | 0.6811 | 48.3 | 87.0 |
| SrGa$_2$S$_4$:Eu (Li/7.5% Si) | 536.2 | 1.07 | 0.2848 | 0.6807 | 48.3 |  |
| SrGa$_2$S$_4$:Eu (2.5% In, Li/2.5% Si) | 536.8 | 0.89 | 0.2831 | 0.6814 | 48.6 | 77.7 |

TABLE 12

Optical Properties of Ba doped, Ca doped, Ca/Ba doped and Li/Si doped SrGa$_2$S$_4$:Eu (5% Eu) - Cavity Test

| Material | Brightness (%) | CIE x | CIE y | QE |
|---|---|---|---|---|
| SrGa$_2$S$_4$:Eu | 97.2 | 0.2048 | 0.3285 | 0.69 |
| SrGa$_2$S$_4$:Eu (2% Ba) | 97.0 | 0.2041 | 0.3282 | 0.69 |
| SrGa$_2$S$_4$:Eu (2% Ca) | 103.7 | 0.2094 | 0.3383 | 0.73 |
| SrGa$_2$S$_4$:Eu (4% Ca, 2% Ba) | 101.0 | 0.2084 | 0.3344 | 0.71 |
| SrGa$_2$S$_4$:Eu (Li/5% Si) | 105.4 | 0.2079 | 0.3426 | 0.75 |

Tables 13-16 provide powder test data for NBG phosphor doped with varying amounts of one or more of Ca, Al, Li, In, Si, Na, La and Y; the amount of Eu activator was also varied.

TABLE 13

Effect of Eu concentration in 2% Ca, 10% Al doped SrGa$_2$S$_4$:Eu - Powder Test

| Material | PE (nm) | PL @ 25° C. | CIE x | CIE y | FWHM (nm) | % PL @100° C. |
|---|---|---|---|---|---|---|
| SrGa$_2$S$_4$:Eu (5%) | 535.9 | 0.98 | 0.2816 | 0.6810 | 49.1 | 86.4 |
| SrGa$_2$S$_4$:Eu (1% Eu, 2% Ca, 10% Al) | 534.6 | 0.90 | 0.2798 | 0.6811 | 50.4 | 85.8 |
| SrGa$_2$S$_4$:Eu (2% Eu, 2% Ca, 10% Al) | 536.7 | 1.15 | 0.2842 | 0.6800 | 49.3 | 85.7 |
| SrGa$_2$S$_4$:Eu (3% Eu, 2% Ca, 10% Al) | 537.5 | 1.21 | 0.2885 | 0.6766 | 49.0 | 84.2 |
| SrGa$_2$S$_4$:Eu (4% Eu, 2% Ca, 10% Al) | 538.3 | 1.19 | 0.2924 | 0.6752 | 49.1 | 83.5 |
| SrGa$_2$S$_4$:Eu (5% Eu, 2% Ca, 10% Al) | 538.3 | 1.20 | 0.2932 | 0.6755 | 48.6 | 83.4 |

TABLE 14

Effect of Eu concentration in Li/5% Si doped SrGa$_2$S$_4$:Eu - Powder test

| Material | PE (nm) | PL @ 25° C. | CIE x | CIE y | FWHM (nm) | % PL @100° C. |
|---|---|---|---|---|---|---|
| SrGa$_2$S$_4$:Eu | 535.9 | 0.98 | 0.2816 | 0.6810 | 49.1 | 86.4 |
| SrGa$_2$S$_4$:Eu (1% Eu, Li/5% Si) | 536.0 | 0.90 | 0.2801 | 0.6814 | 49.1 | 87.1 |
| SrGa$_2$S$_4$:Eu (2% Eu, Li/5% Si) | 537.1 | 1.09 | 0.2864 | 0.6776 | 48.2 | 86.7 |
| SrGa$_2$S$_4$:Eu (3% Eu, Li/5% Si) | 537.7 | 1.18 | 0.2892 | 0.6760 | 48.3 | 84.6 |
| SrGa$_2$S$_4$:Eu (4% Eu, Li/5% Si) | 538.5 | 1.14 | 0.2940 | 0.6731 | 47.6 | 85.3 |
| SrGa$_2$S$_4$:Eu (5% Eu, Li/5% Si) | 539.1 | 1.19 | 0.2974 | 0.6697 | 47.4 | 85.4 |

TABLE 15

Optical Properties of Na/Si doped, La doped, Y doped and Ca/Al doped SrGa$_2$S$_4$:Eu (5% Eu) - Powder Test

| Material | PE (nm) | PL @ 25° C. | CIE x | CIE y | FWHM (nm) | % PL @100° C. |
|---|---|---|---|---|---|---|
| SrGa$_2$S$_4$:Eu | 535.9 | 0.98 | 0.2816 | 0.6810 | 49.1 | 86.4 |
| SrGa$_2$S$_4$:Eu (Na/5% Si) | 537.6 | 0.91 | 0.2886 | 0.6792 | 47.5 | 81.8 |
| SrGa$_2$S$_4$:Eu (5% La) | 541.5 | 0.51 | 0.3307 | 0.6440 | 53.5 | |
| SrGa$_2$S$_4$:Eu (5% Y) | 537.6 | 1.33 | 0.2887 | 0.6782 | 48.5 | 84.0 |
| SrGa$_2$S$_4$:Eu (2% Ca, 10% Al) | 537.4 | 1.22 | 0.2892 | 0.6776 | 49.1 | 86.5 |

TABLE 16

Optical Properties of Li/Si doped, Si doped, Ca/Al doped, Y doped and Li/Y doped SrGa$_2$S$_4$:Eu (2% Eu) - Powder test

| Material | PE (nm) | PL @ 25° C. | CIE x | CIE y | FWHM (nm) | % PL @100° C. |
|---|---|---|---|---|---|---|
| SrGa$_2$S$_4$:Eu (Li/5% Si) | 537.0 | 1.08 | 0.2837 | 0.6803 | 48.6 | 86.4 |
| SrGa$_2$S$_4$:Eu (5% Si) | 536.4 | 1.06 | 0.2829 | 0.6804 | 49.1 | 86.0 |
| SrGa$_2$S$_4$:Eu (5% Ca, 5% Al) | 537.7 | 1.08 | 0.2902 | 0.6757 | 49.5 | 84.5 |
| SrGa$_2$S$_4$:Eu (5% Y) | 536.6 | 0.99 | 0.2816 | 0.6798 | 49.1 | 84.6 |
| SrGa$_2$S$_4$:Eu (5% Li, 5% Y) | 537.4 | 1.07 | 0.2879 | 0.6767 | 49.1 | 83.1 |

Figure 4:
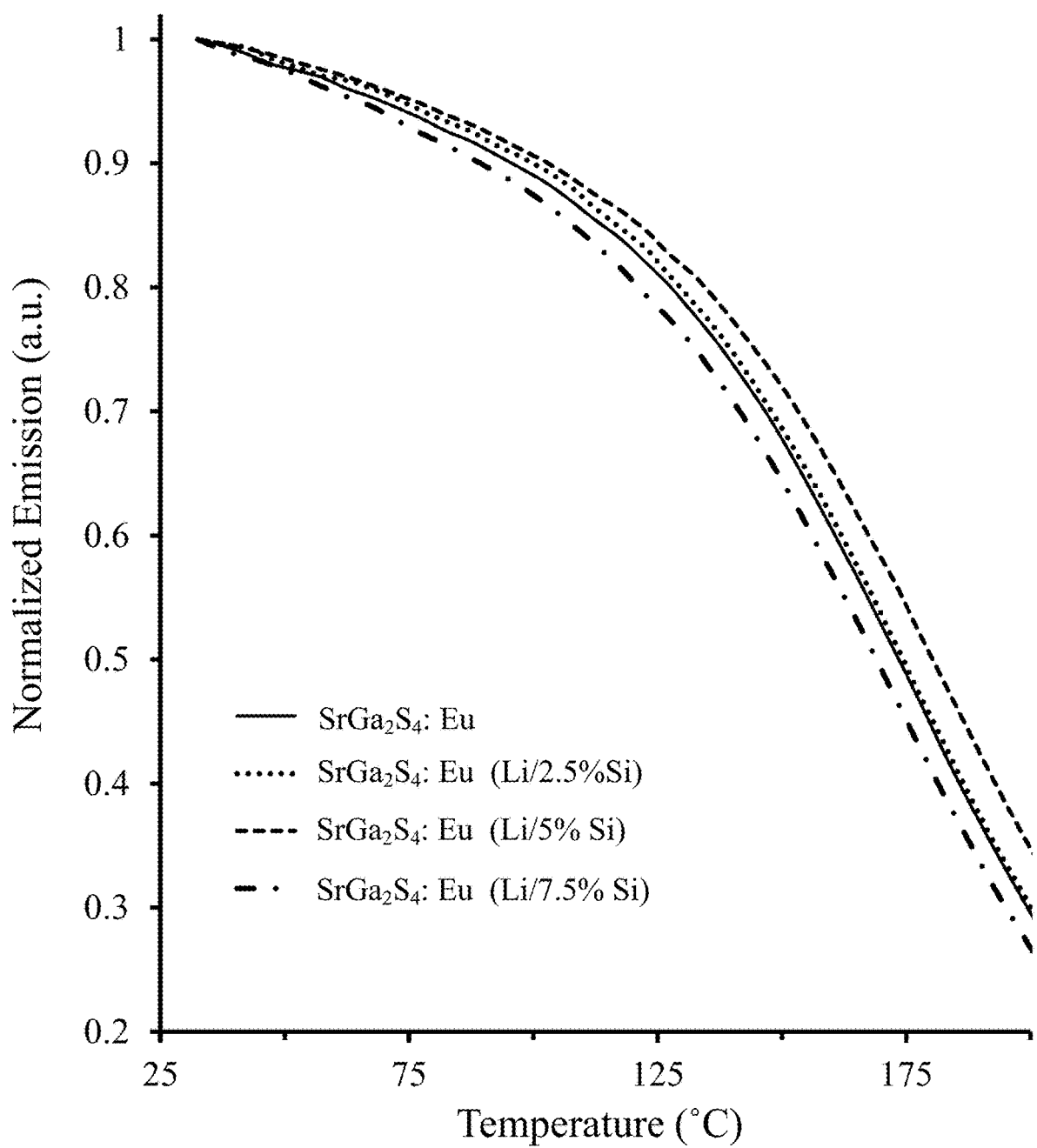
FIG. 4 shows normalized peak emission versus temperature for NBG phosphor and NBG phosphor doped with various amounts of Li/Si, according to some embodiments of the invention.

FIG. 4 shows normalized peak emission versus temperature for NBG phosphor and NBG phosphor doped with various amounts of Li/Si, according to some embodiments of the invention. Li/Si doped NBG phosphor is shown to provide improved thermal properties compared to the undoped NBG, and the optimal doping amount was about 5% Si (measured as mole percent of gallium).

Phosphor Coating

Figure 5:
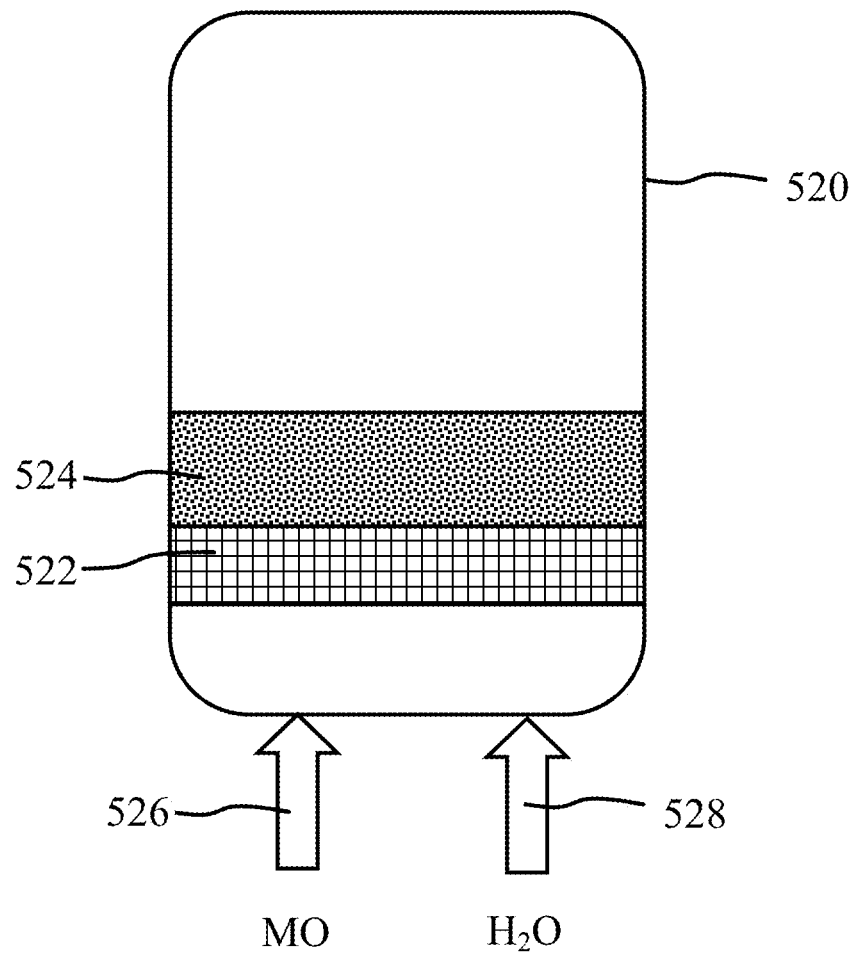
FIG. 5 is a schematic representation of a phosphor particle coating apparatus, according to some embodiments of the invention.

The NBG particles are coated by a CVD process in a fluidized bed reactor. FIG. 5 is a schematic representation of a phosphor particle coating apparatus according to an embodiment of the invention. Reactor 520 comprises a porous support disc 522, over which phosphor powder 524 is held, and inlets 526 and 528 for metal organic (MO) precursor and water (H$_2$O) vapor, respectively. The coating materials may be one or more materials chosen from the group consisting of aluminum oxide, silicon oxide, titanium oxide, zinc oxide, magnesium oxide, zirconium oxide and chromium oxide. The thickness may typically be in the range of 100 nm (nanometers) to 5 μm (microns), in embodiments in the range of 50 nm to 100 nm, 100 nm to 500 nm, 500 nm to 1 μm, or 1 μm to 2 μm. Herein, unless otherwise specified, coated NBG samples used in the examples herein are coated with approximately 1 micron (μm) of alumina.

In a typical coating process, the phosphor powder sample was loaded into the reactor and heated to 100-250° C., preferably 200° C., under N$_2$ gas flow. A metal oxide precursor such as TrimethylAluminum (TMA), Titanium tetra-chloride (TiCl$_4$), Silicon tetra-chloride (SiCl$_4$), or DimethylZinc was introduced in to the reactor with a N$_2$ carrier gas through a bubbler. H$_2$O vapor was also introduced into the reactor to react with the metal oxide precursor to form oxide coating layers on phosphor particles. Complete fluidization of the particles being coated (from gas flow optimization, etc.) without any dead space is important to ensure homogeneous coating of all phosphor particles. In a typical coating conducted at 200° C., for a 250 g phosphor particle loading of the reactor, the coating was produced with a metal oxide precursor feeding rate of 1 to 10 g/hour for 4 hours, while feeding H$_2$O at a rate of 2 to 7 g/hour. It is shown below that these conditions can produce dense and substantially pinhole-free coatings of uniform thickness, with a theorized percentage solid space (percentage bulk density) of greater than 95% and in embodiments greater than 97% and in embodiments greater than 99%. In this patent specification, percentage solid space=(bulk density of the coating/density of the material within a single particle)×100. It will be understood that the percentage solid space (% solid space) provides a measure of the porosity of the coating resulting from pinholes. It is believed by the present inventors that outside of: the specified feeding rate range for oxide precursor, the specified feeding rate range for H$_2$O, and/or the specified 100-250° C. temperature range, the coated phosphors may not exhibit the reliability documented herein.

In the case of alumina coatings the inventors expect the coatings to be a dense amorphous oxide coating layer on the NBG phosphor particle surface without pinholes (pinhole-free) that is, a dense water impermeable coating.

Characterization of Coated Phosphor

Figure 6A:
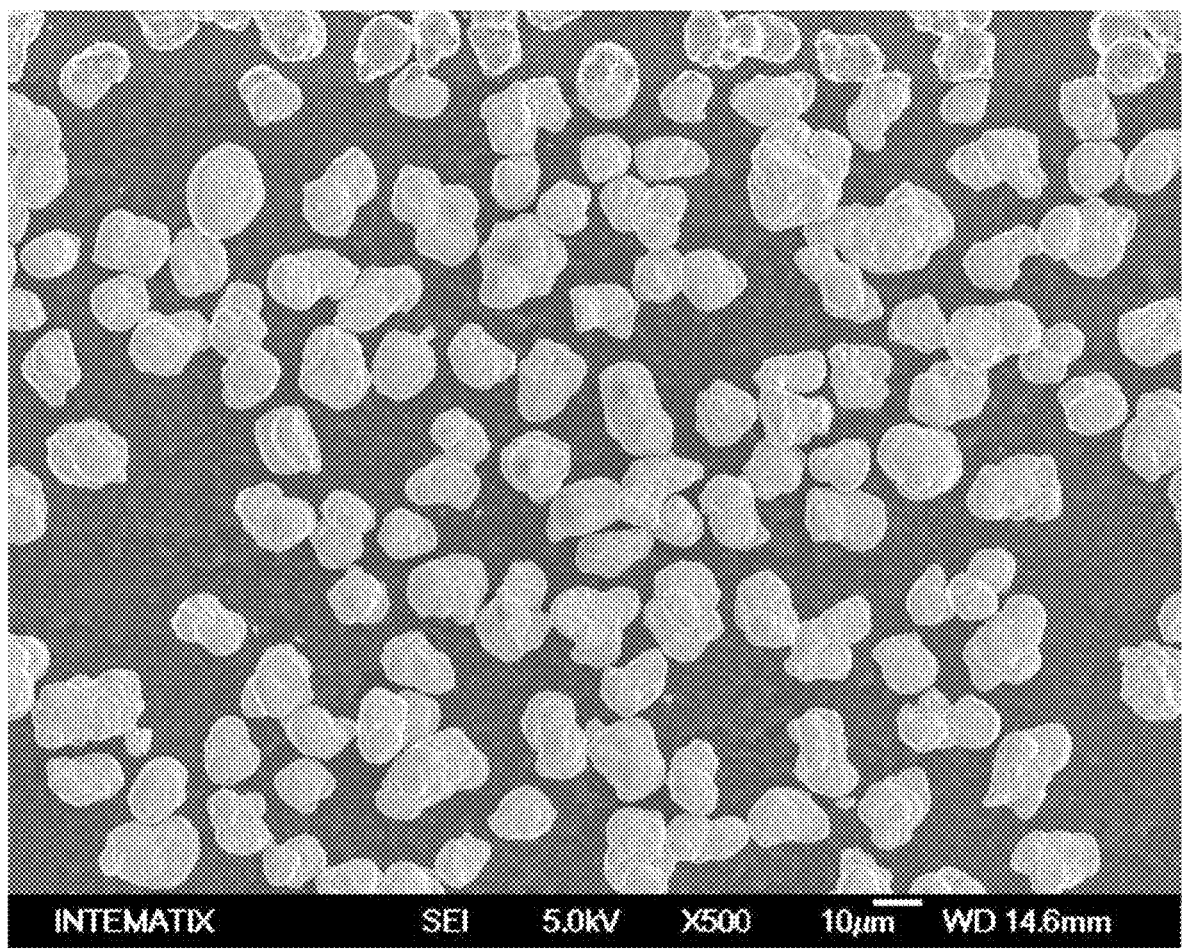
FIGS. 6A-6E are SEM micrographs of alumina coated NBG phosphor particles, according to an embodiment of the invention.
Figure 6B:
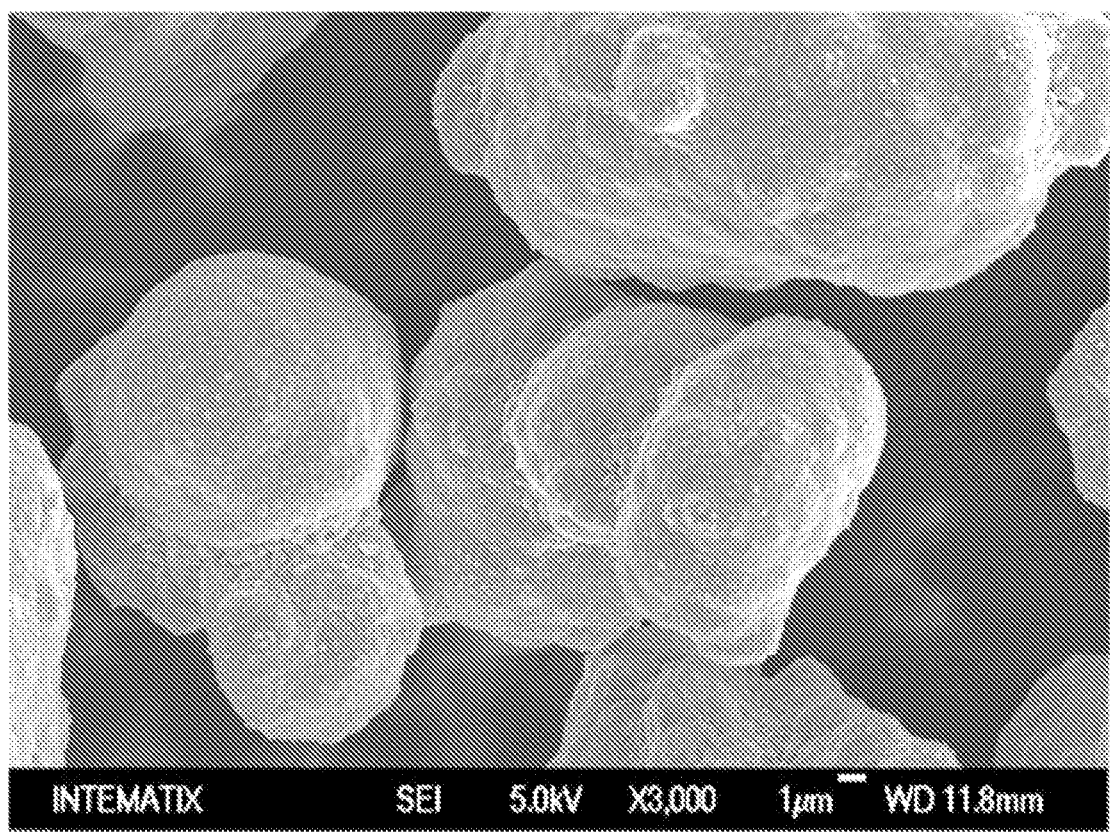
Figure 6C:
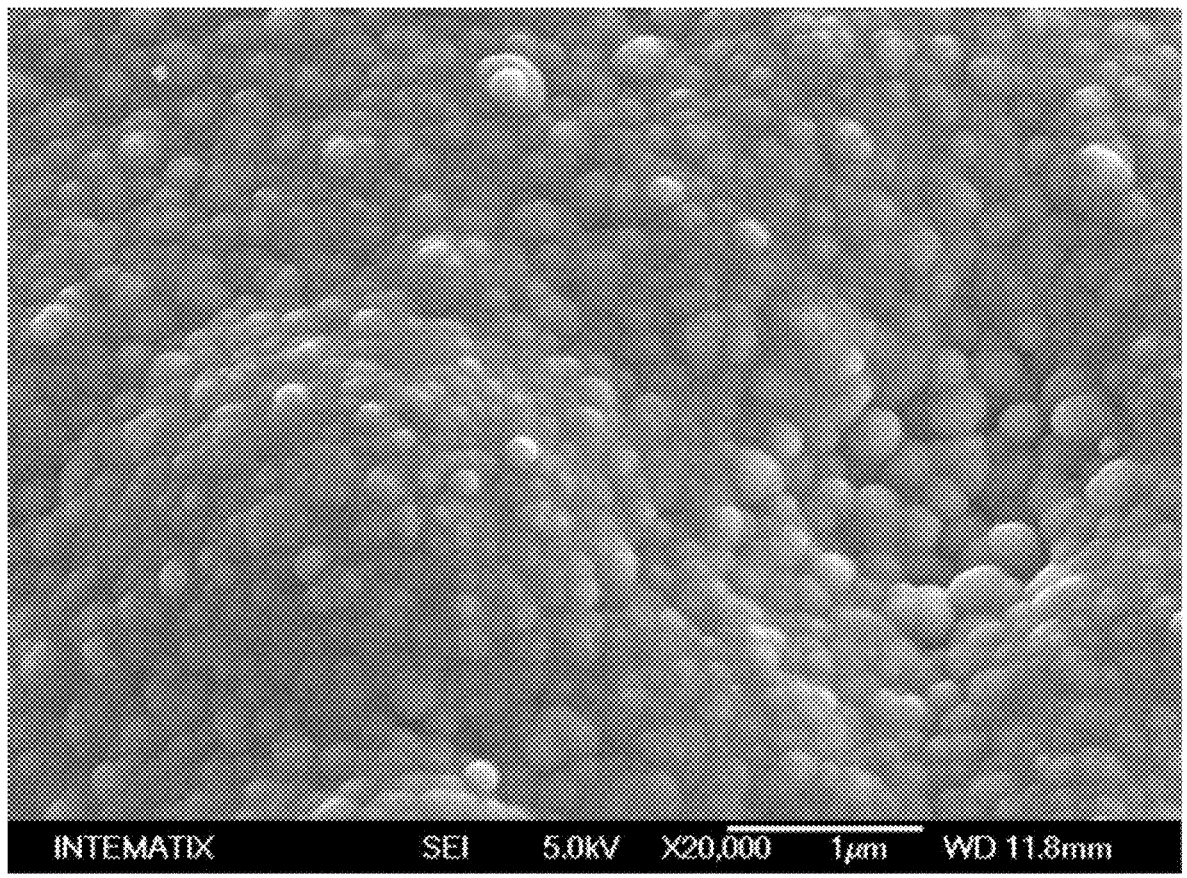
Figure 6D:
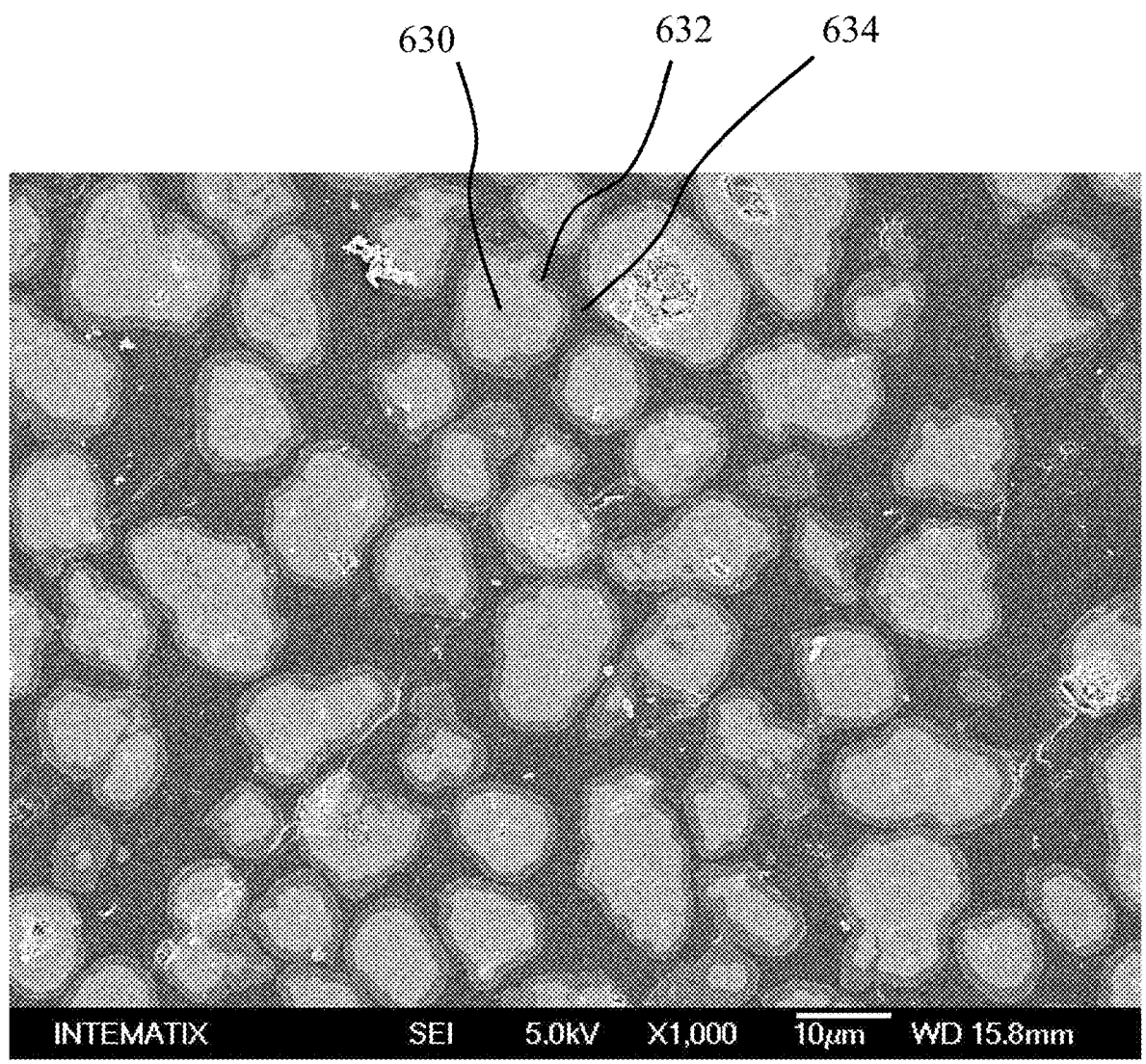
Figure 6E:
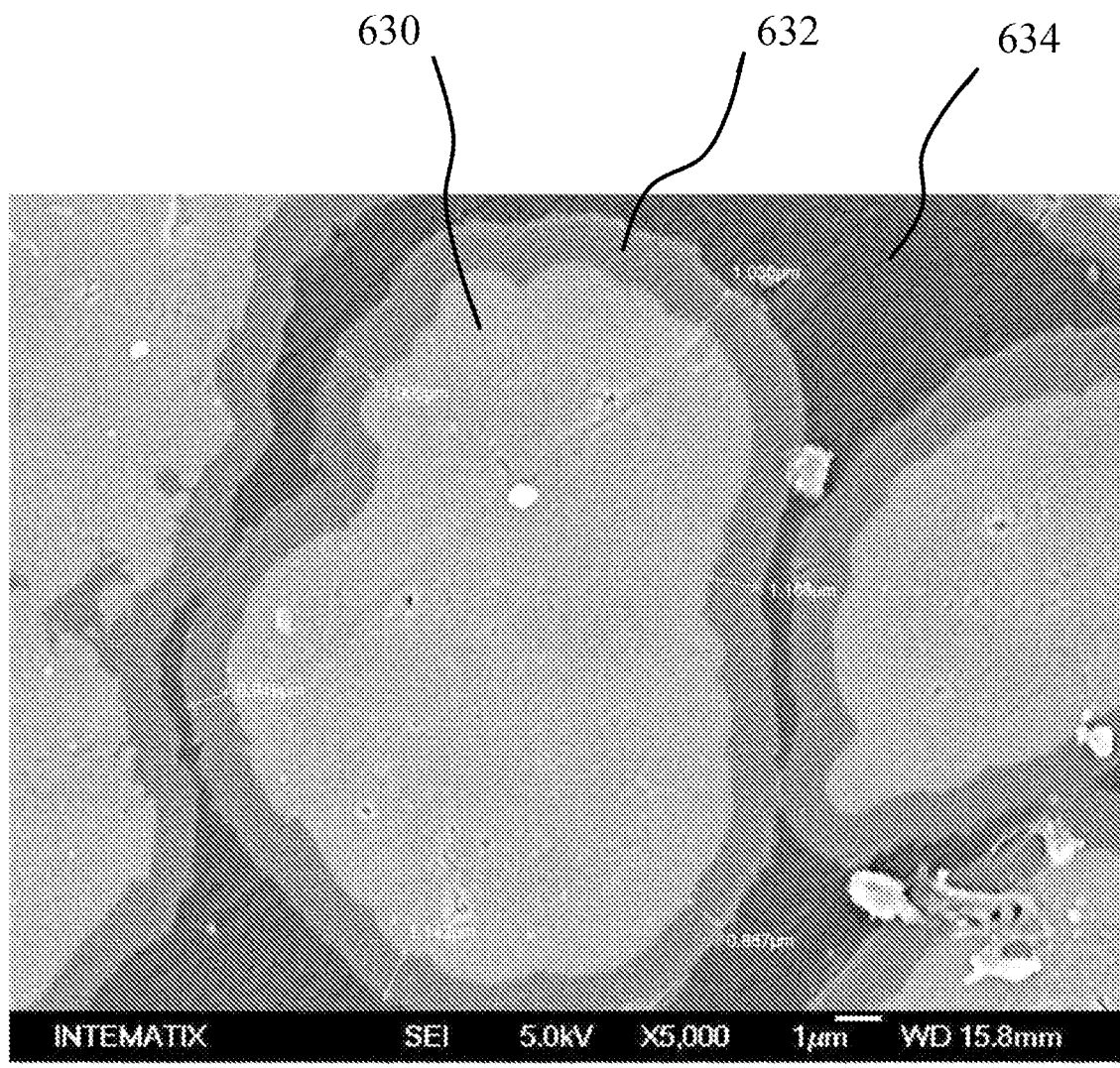

FIGS. 6A-6E show SEM micrographs of alumina coated NBG phosphor particles, according to an embodiment of the invention. In FIGS. 6D and 6E a cross-section is shown where phosphor particles 630 are seen coated with a uniform dense impermeable (pinhole-free) coating of alumina 632 of approximately one micron in thickness—a variation in thickness was measured over the range of 0.87 μm to 1.17 μm; the particles are mounted in epoxy 634 for making the cross-sections. The samples were prepared by dispersing the phosphor particles in epoxy then curing. After curing, the epoxy (with coated NBG powder) was polished and then covered by a flash of sputtered Pd—Au metal to enhance the sample's electronic conductivity (the metal reduces/removes electron charging when analyzing the sample in the SEM). The prepared cross section sample was then analyzed by scanning electron microscopy (SEM) which clearly shows the hermetic coating layer of alumina around the NBG particles (complete coverage by coating layer of particle without observable gaps or pinholes), as shown in FIGS. 6D & 6F.

Figure 7A:
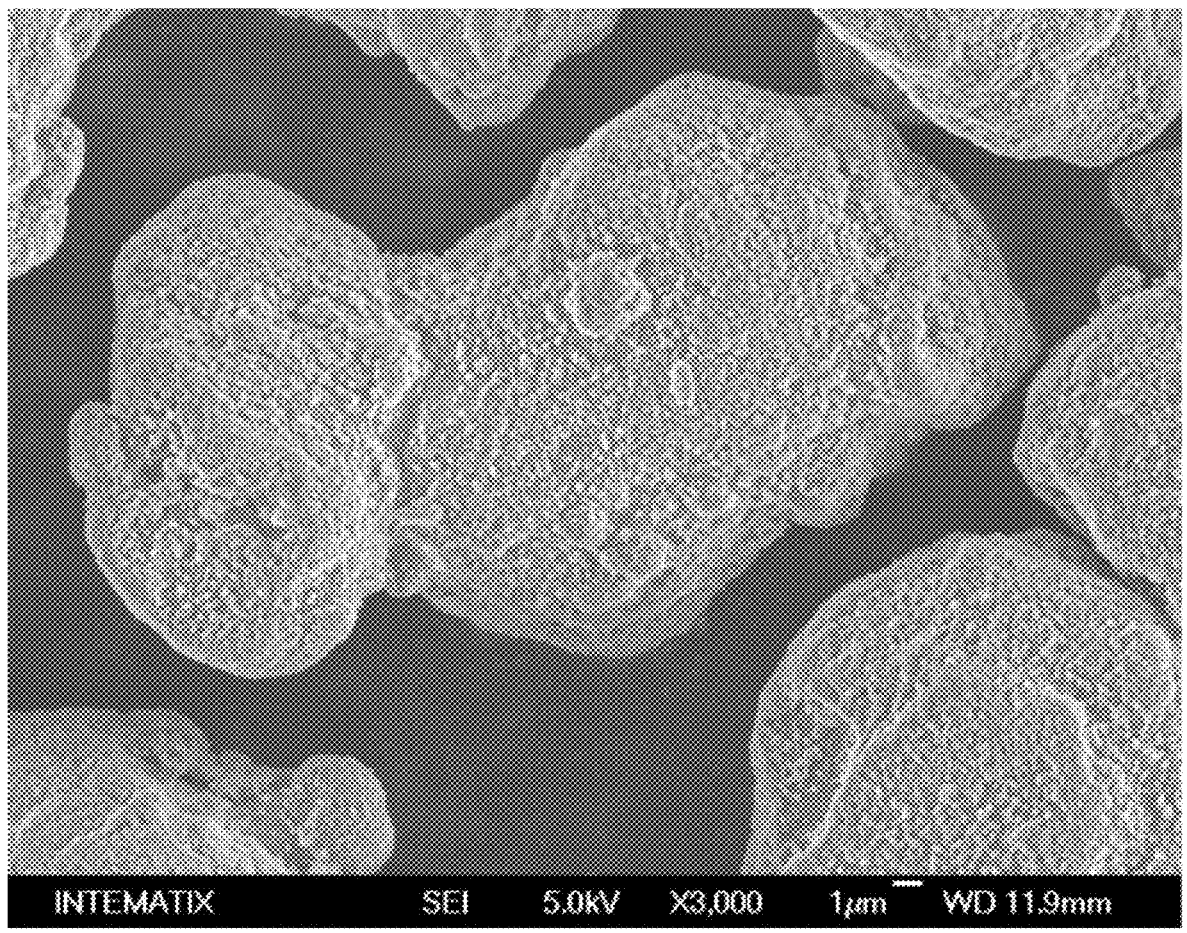
FIGS. 7A-7D are SEM micrographs of M535 coated alkaline earth metal thiogallate phosphor particles.
Figure 7B:
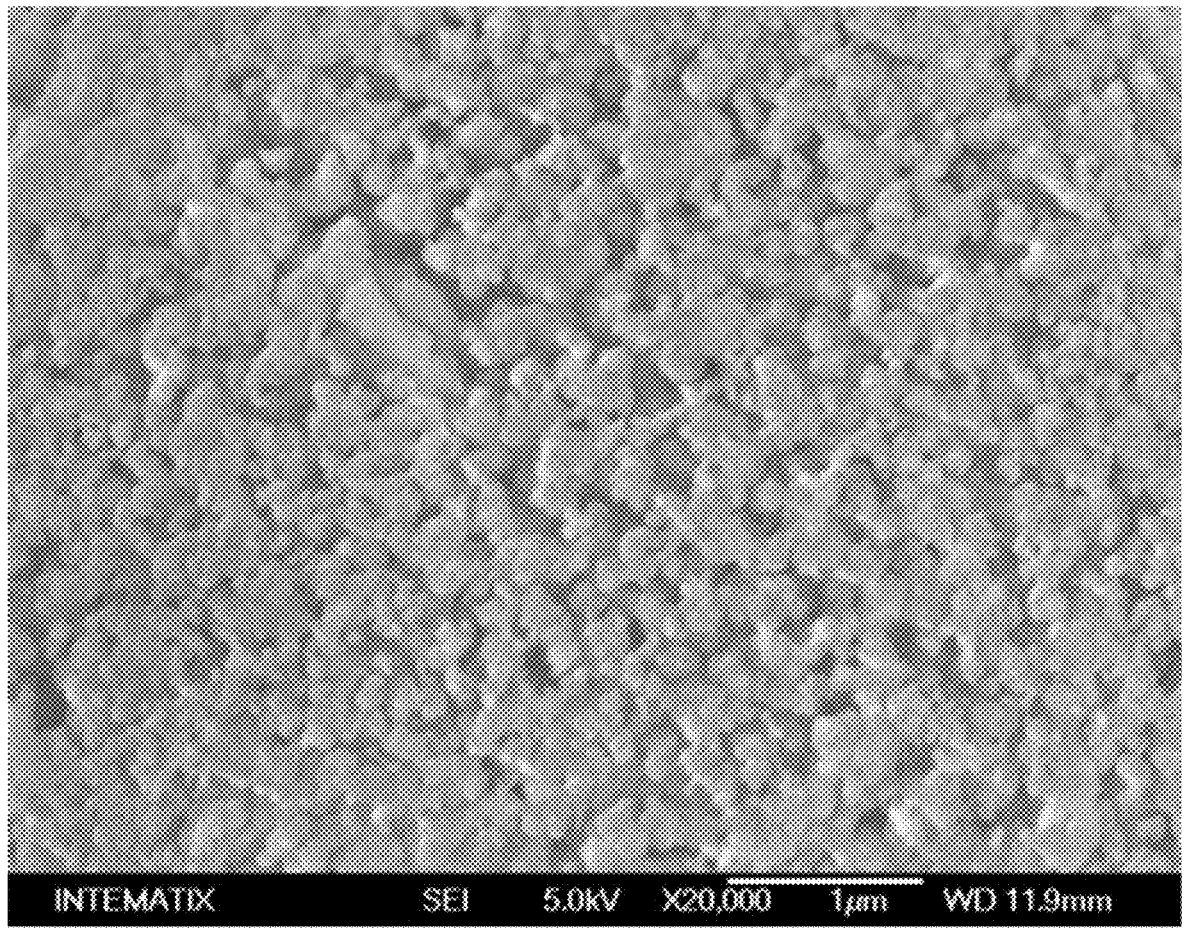
Figure 7C:
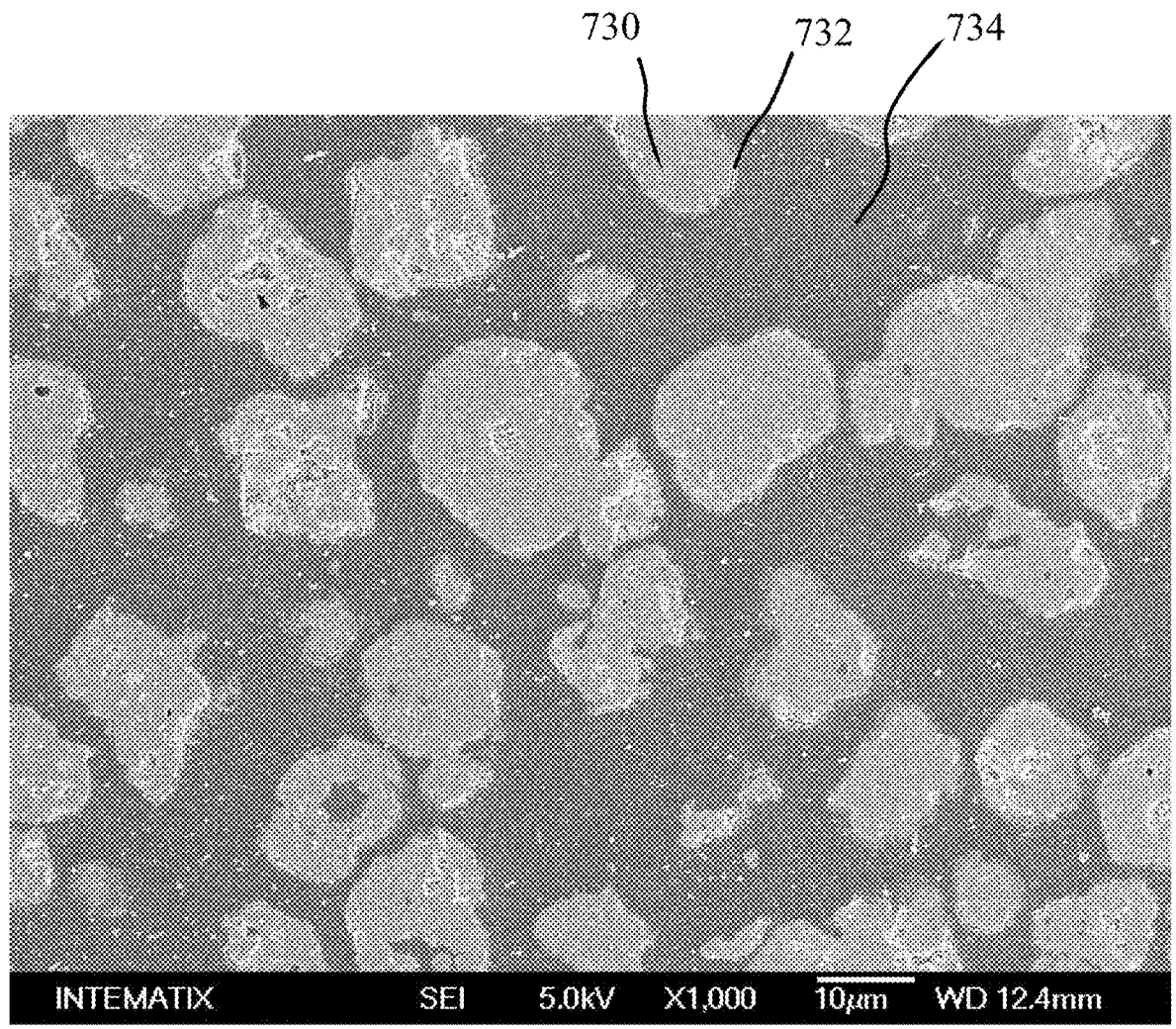
Figure 7D:
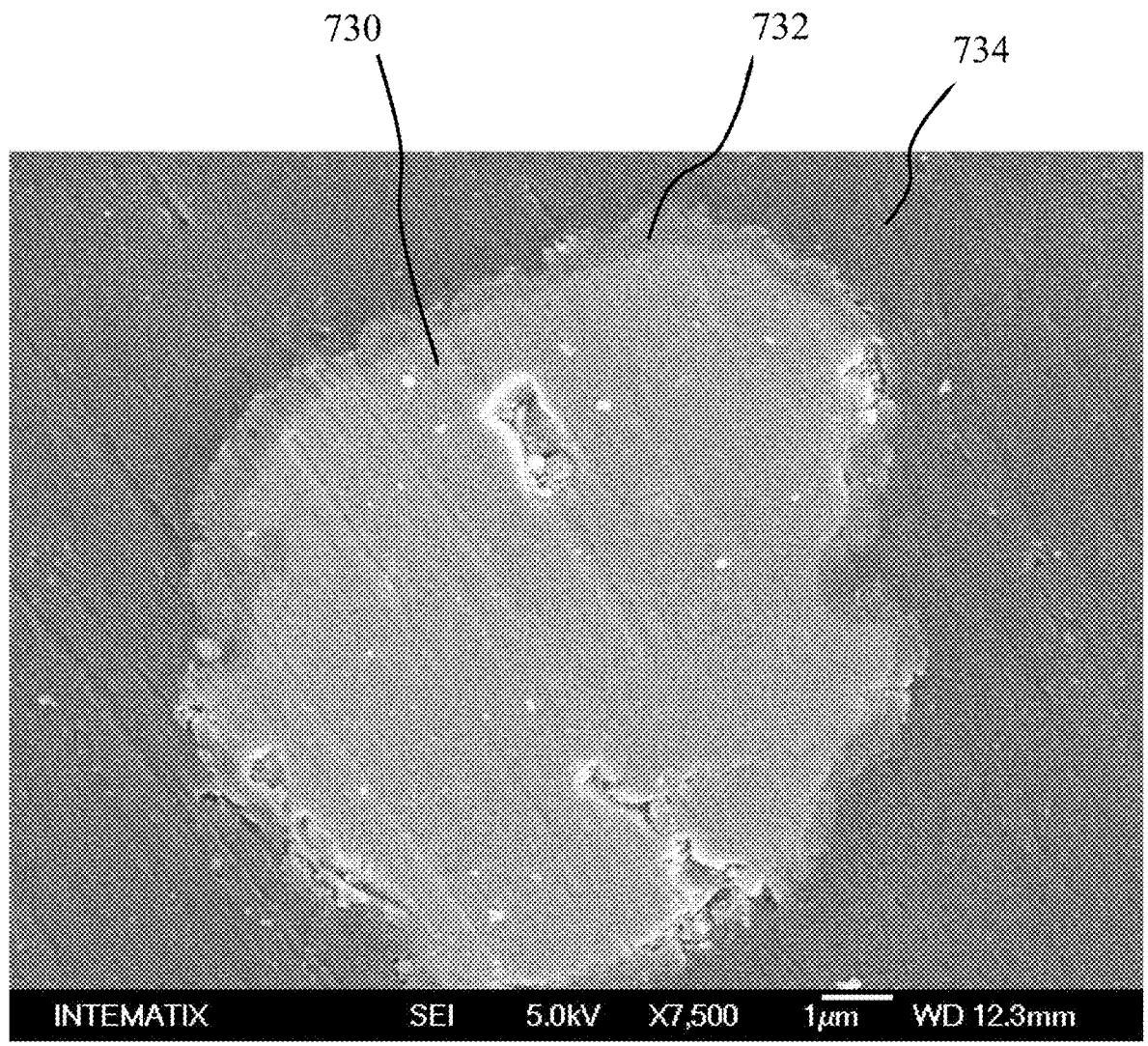

FIGS. 7A-7D show SEM micrographs of M535 phosphor particles—M535 is a coated alkaline earth metal thiogallate phosphor available from Dow Chemical. In FIGS. 7C and 7D a cross-section is shown where phosphor particles 730 are seen coated with a coating 732 of approximately 0.4 μm in thickness—a variation in thickness was measured over the range of less than 0.1 μm (100 nm) to 0.5 μm (500 nm); the particles are mounted in epoxy 734 for making the cross-sections. The SEM samples were prepared as described above. FIGS. 7C & 7D clearly show a non-uniform coating layer around the M535 particles (incomplete coverage by coating layer of particle with observable gaps and pinholes).

The stability and reliability of the coated NBG phosphor particles of the present invention may be established using a silver test, as follows. Silver ions ($Ag^+$) can attack sulfur in NBG phosphors to form a black $Ag_2S$ compound if the NBG surface is not well protected (for example, if pinholes are present in the coating then black $Ag_2S$ spots would form). The silver test is based on this mechanism and involves soaking the coated NBG materials in $AgNO_3$ solution to evaluate how well the coating layer is able to protect the NBG phosphor particle against $Ag^+$ attack. The longer the time the NBG phosphor can survive in the Ag test, the better the surface protection (coating/reliability) the phosphor has.

In a Ag test, NBG powder was soaked in 1 mole/liter $AgNO_3$ solution, and the stability of the sample was evaluated by monitoring how long the powder can survive without turning black at room temperature, 50° C. and 85° C. For comparison, it is noted that uncoated NBG samples turn black in less than one minute. Test results show that a coated sample, prepared as described herein, can survive without blackening for more than: 24 hours at room temperature; 24 hours at 50° C.; and 3 hours at 85° C.

The stability and reliability of the coated NBG phosphor particles of the present invention may also be established using an electrical conductivity test. In this test uncoated and coated NBG particles are dispersed in de-ionized water and the electrical conductivity is monitored over time—increases in conductivity being attributed to release of ions into solution from the particles. An Oakton waterproof CON 150 meter was used for these tests. Samples were 0.1 g of phosphor particles dispersed in 10 ml of distilled water. Results for alumina coated NBG and uncoated NBG are shown in Table 17. The alumina coated phosphor clearly performs much better in this test, indicating the alumina coating is providing good protection of the phosphor from attack by water and dissolution.

TABLE 17

Electrical conductivity versus time for $SrGa_2S_4$:Eu (5% Eu) and alumina ($Al_2O_3$) coated for $SrGa_2S_4$:Eu (5%) - 0.1 g phosphor dispersed in 10 ml de-ionized water

| Material | Electrical Conductivity @ 25° C. (μs) | | | | | |
|---|---|---|---|---|---|---|
| | 0 hour | 0.5 hour | 1 hour | 2 hour | 3 hour | 4 hour |
| $SrGa_2S_4$:Eu | 8.6 | 38.7 | 83.0 | 216.0 | 219.0 | 218.0 |
| Alumina coated $SrGa_2S_4$:Eu | 1.4 | 9.2 | 10.8 | 11.6 | 12.1 | 12.0 |

The coated phosphor samples are also tested in packaged form, referred to herein as package test. The coated NBG phosphor is mixed with other phosphors in an optical encapsulant, such as Phenylsiloxane resin OE6630 available from Dow Corning. The mixture of phosphors and encapsulant are loaded in an LED package, such as SMD 7020 LED module. The encapsulant is cured and optical measurements are made, as described below. Furthermore, the packaged phosphors are subjected to accelerated testing conditions, known as "wet high temperature operating life" testing and referred to herein as WHTOL—the testing requires exposure to 85° C./85% RH (relative humidity) while operating at 120 mA.

Figure 8:
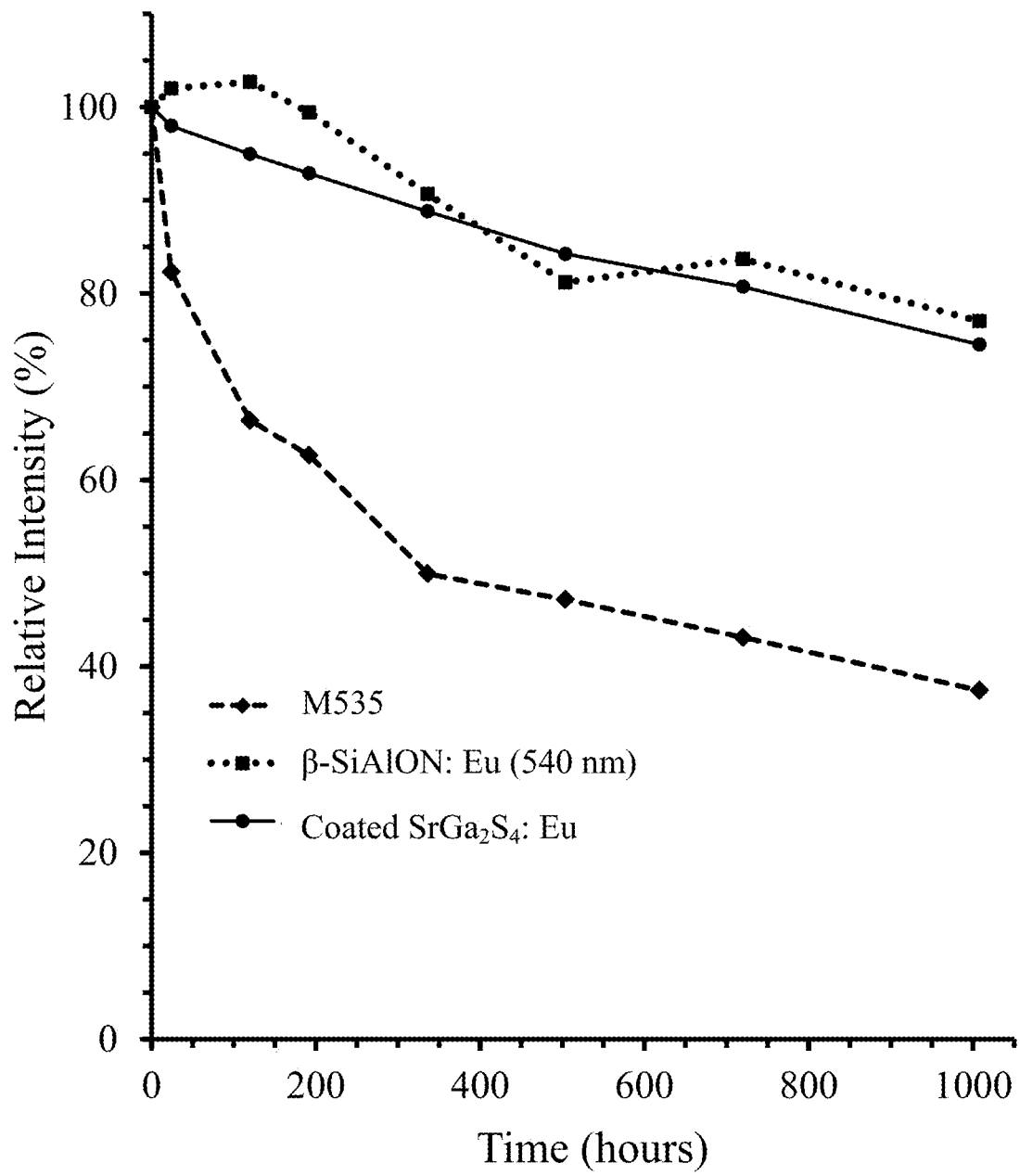
FIG. 8 shows reliability data, relative photoluminescence intensity versus time, for an LED (SMD 7020 LED module 450.0-452.5 nm) operated under accelerated testing conditions WHTOL 85° C./85% RH for (i) alumina coated NBG phosphor, according to an embodiment of the invention, (ii) M535 phosphor, and (iii) β-SiAlON:Eu (540 nm) phosphor.
Figure 9:
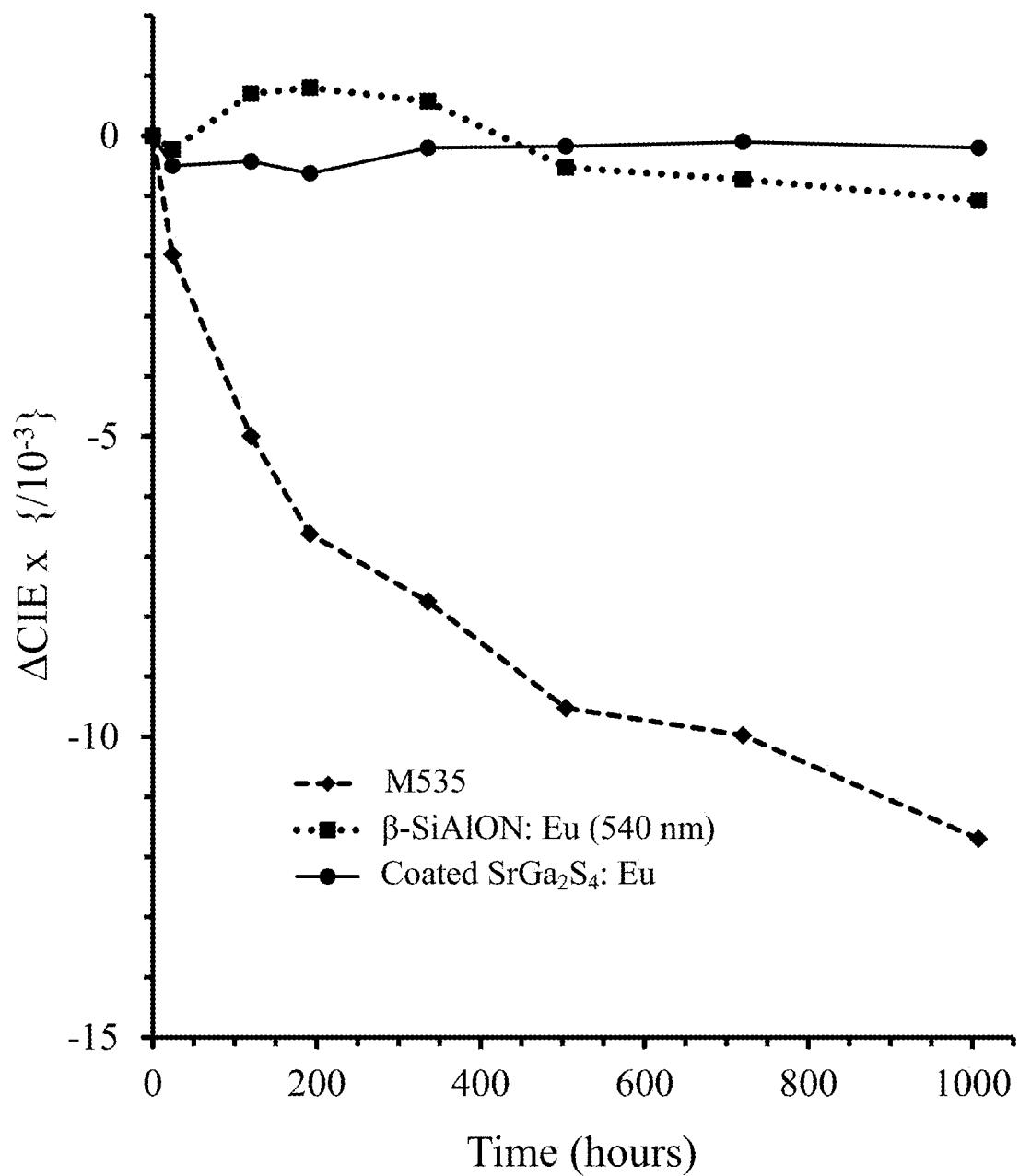
FIG. 9 shows reliability data, change of chromaticity ΔCIE x versus time, for an LED (SMD 7020 LED module 450.0-452.5 nm) operated under accelerated testing conditions WHTOL 85° C./85% RH for (i) alumina coated NBG phosphor, according to an embodiment of the invention, (ii) M535 phosphor, and (iii) β-SiAlON:Eu (540 nm) phosphor.
Figure 10:
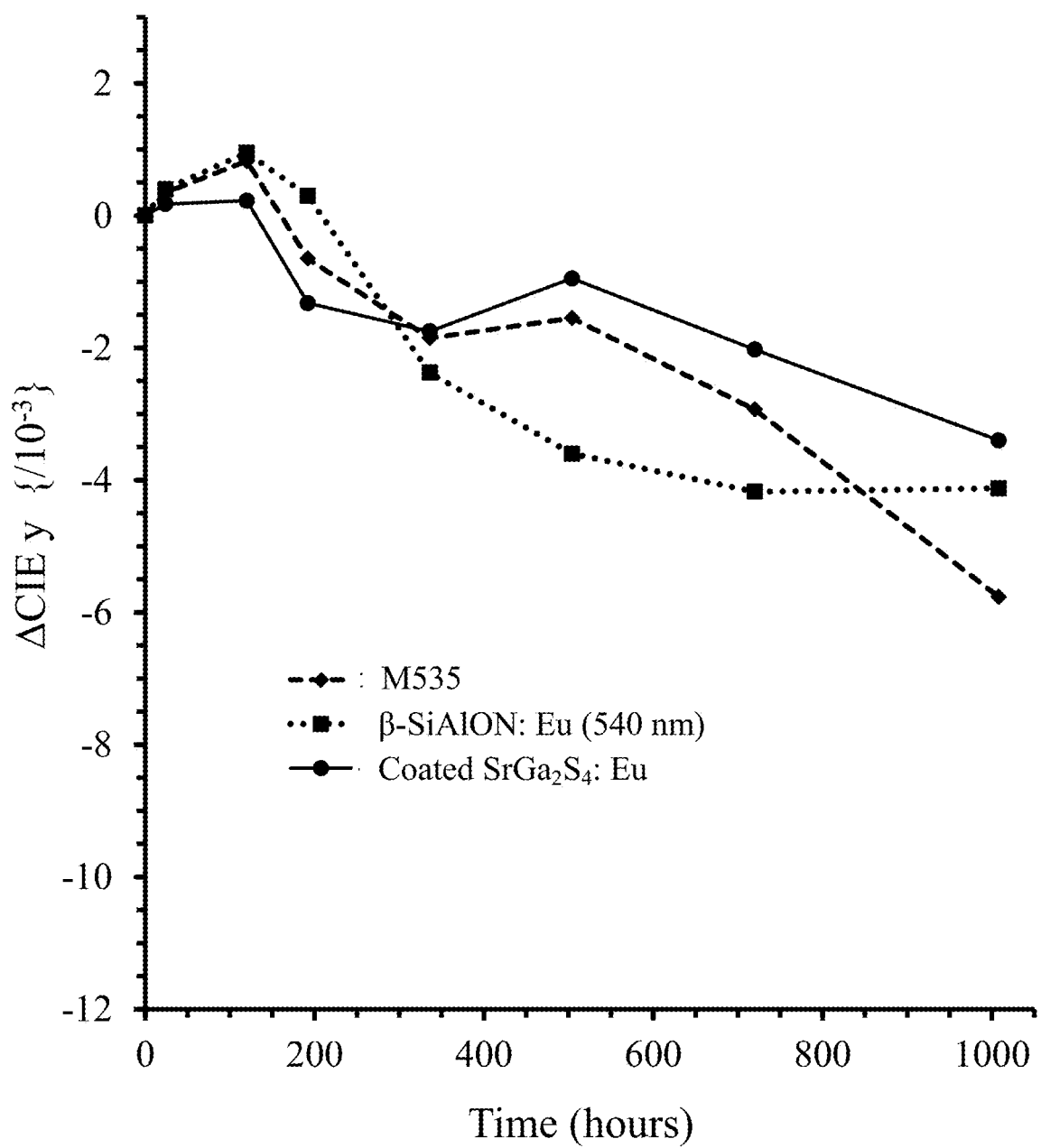
FIG. 10 shows reliability data, change of chromaticity ΔCIE y versus time, for an LED (SMD 7020 LED module 450.0-452.5 nm) operated under accelerated testing conditions WHTOL 85° C./85% RH for (i) alumina coated NBG phosphor, according to an embodiment of the invention, (ii) M535 phosphor, and (iii) β-SiAlON:Eu (540 nm) phosphor.

FIG. 8 shows reliability data, relative photoluminescence intensity versus time, for an LED (SMD 7020 LED module 450.0-452.5 nm) operated under accelerated testing conditions WHTOL 85° C./85% RH for (i) alumina coated NBG phosphor, according to an embodiment of the invention, (ii) M535 phosphor, and (iii) β-SiAlON:Eu (540 nm) phosphor. FIG. 9 shows reliability data, change of chromaticity ΔCIE x versus time, for the same samples as in FIG. 8. FIG. 10 shows reliability data, change of chromaticity ΔCIE y versus time, for the same samples as in FIGS. 8 & 9. The figures show the brightness and CIE of the white LED package with the alumina coated NBG phosphor of the present invention is as stable as the control package with β-SiAlON:Eu phosphor, and exhibits much better stability than the package with M535.

Figure 11A:
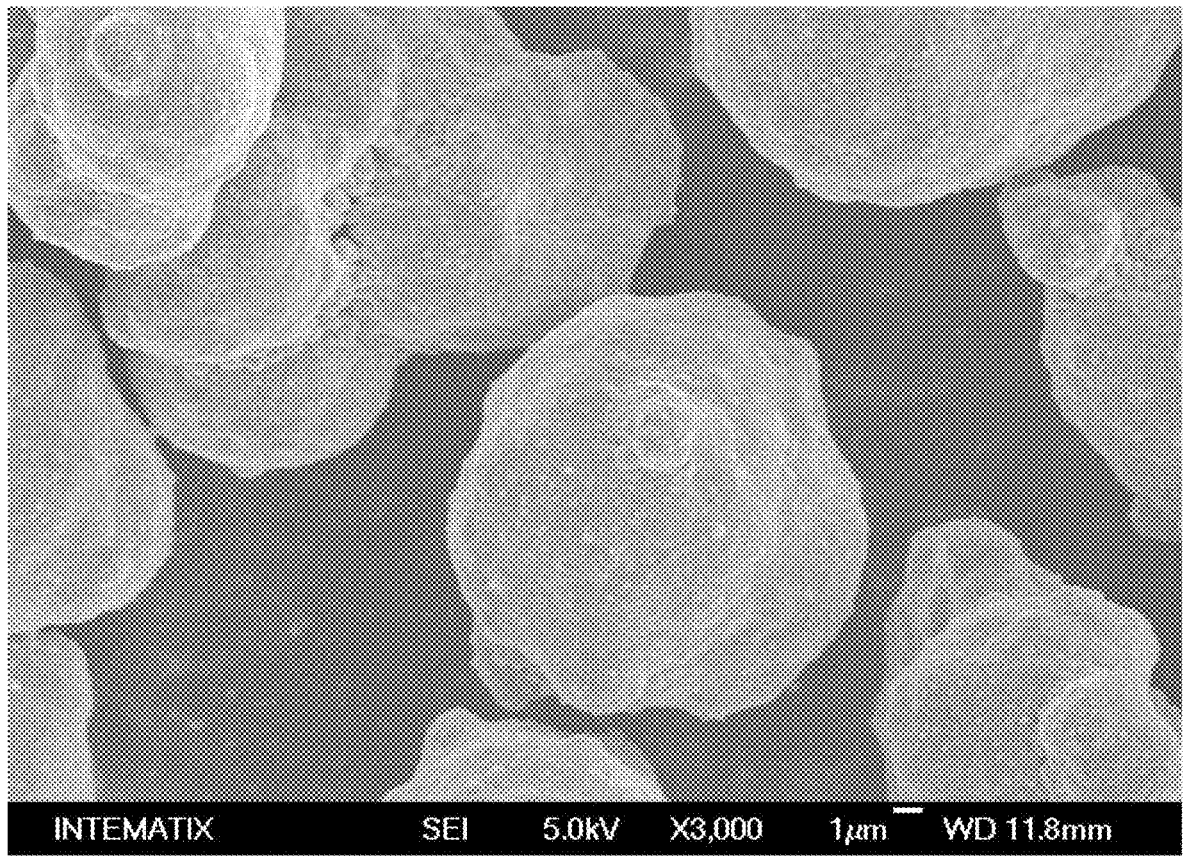
FIGS. 11A-11C are SEM micrographs of multi—layer coated (alumina—aluminum oxide—$Al_2O_3$, titania—titanium dioxide—$TiO_2$) NBG phosphor particles, according to an embodiment of the invention.
Figure 11B:
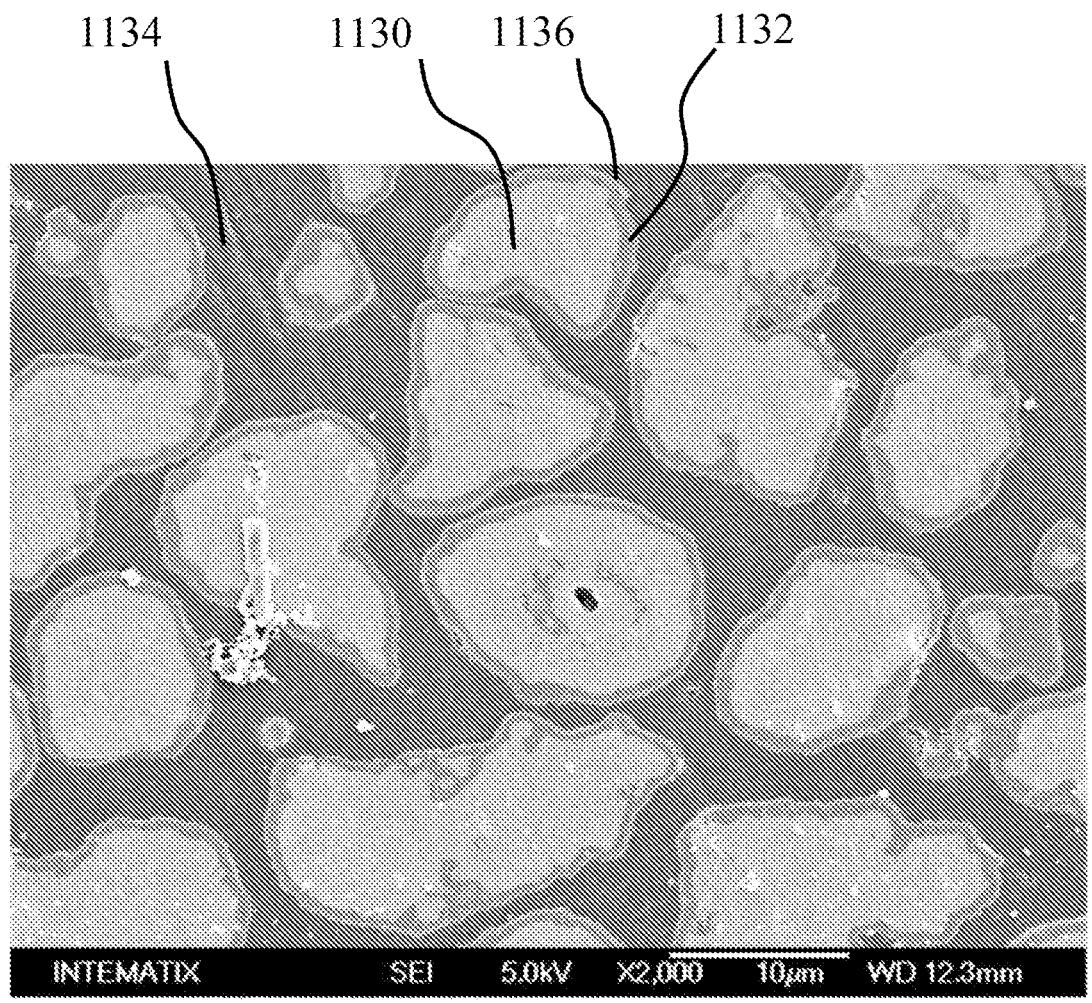
Figure 11C:
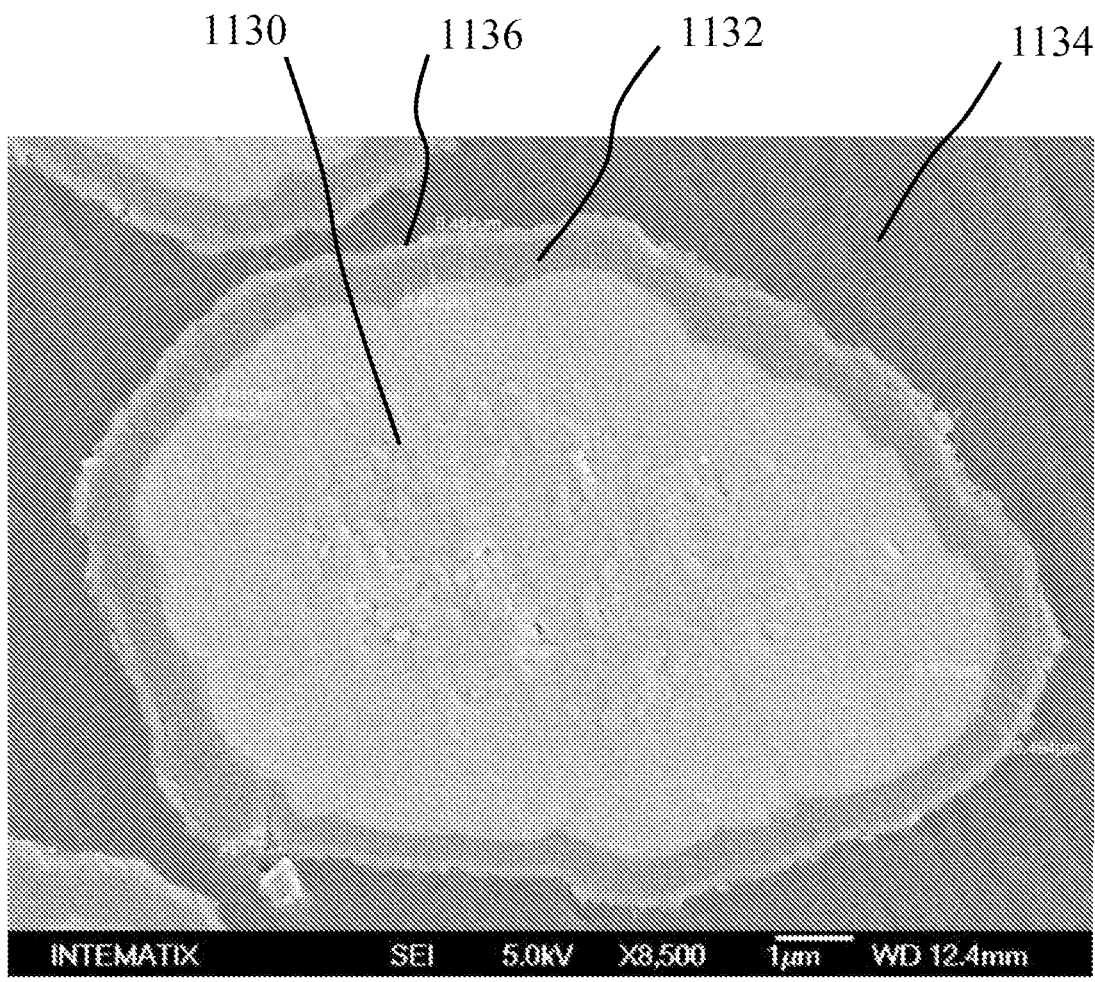

FIGS. 11A-11C show SEM micrographs of multi-layer coated (alumina—aluminum oxide—$Al_2O_3$, titania—titanium dioxide—$TiO_2$) NBG phosphor particles, according to an embodiment of the invention. In FIGS. 11B and 11C a cross-section is shown where phosphor particles 1130 are seen coated with a uniform pinhole-free (impermeable) coating of alumina 1132 of approximately 0.5 μm in thickness—a variation in thickness was measured cover the range of 0.46 μm to 0.62 μm—followed by a second coating of titania 1136 of approximately 0.1 μm in thickness; the particles are mounted in epoxy 1134 for making the cross-sections. The SEM samples were prepared as described above. FIGS. 11B & 11C clearly show the hermetic coating layer of alumina around the NBG particles (complete coverage by coating layer of particle without observable gaps or pinholes). WHTOL testing under 60° C./90% RH of packages with alumina/titania coated NBG phosphor particles shows improved performance over packages with alumina coated NBG phosphor particles when combined with KSF narrow band red phosphor particles; the data suggests that the titania layer over the alumina coating may improve the protection by the coating of the phosphor in a humid environment.

Figure 12:
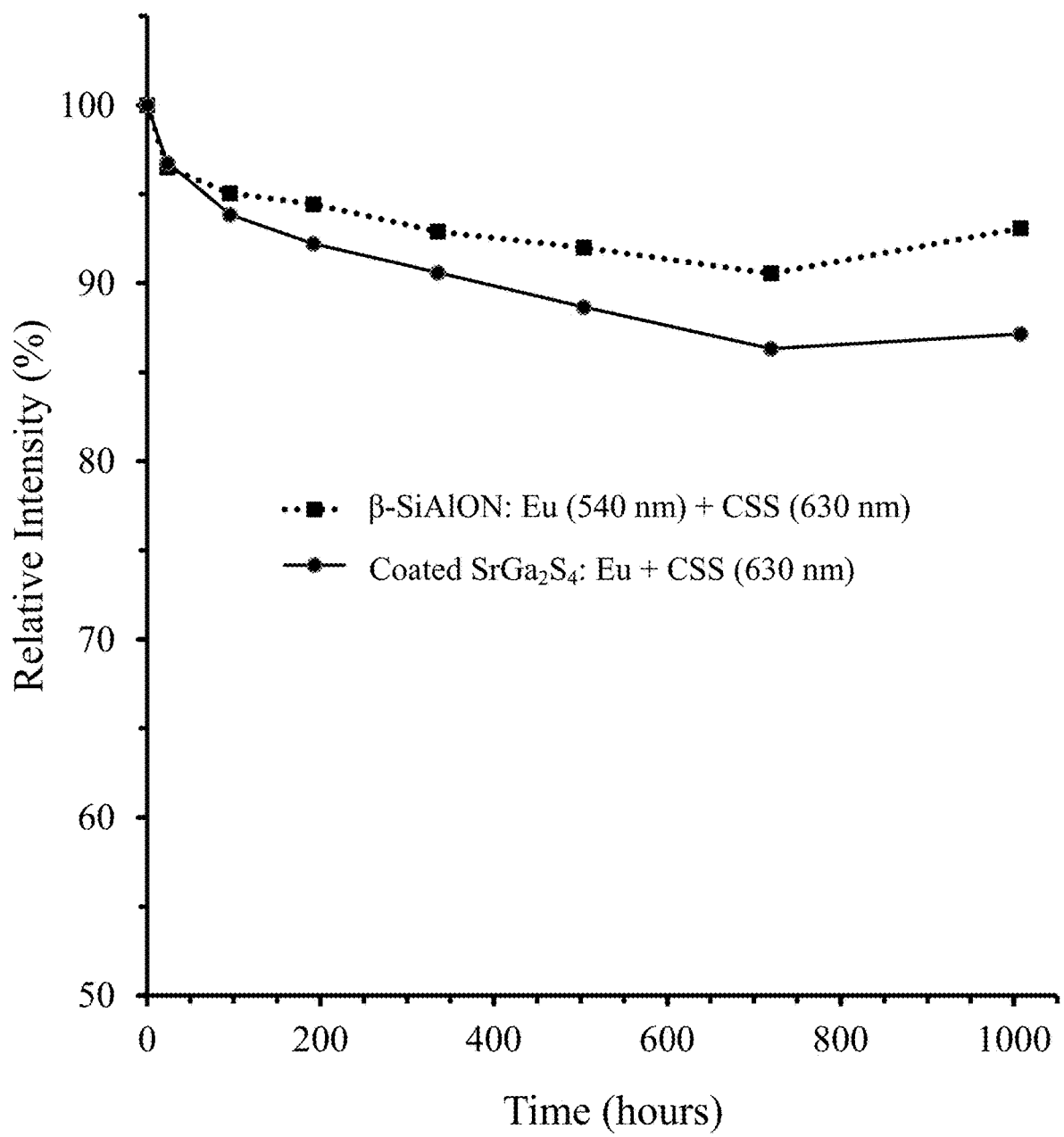
FIG. 12 shows reliability data, relative photoluminescence intensity versus time, for a white light emitting device (SMD 7020 LED module) operated under accelerated testing conditions WHTOL 85° C./85% RH for a blue LED (450.0-452.5 nm) combined with (i) alumina coated NBG phosphor and CSS red phosphor (alumina coated $CaSe_{1-x}S_x$:Eu; 630 nm), according to an embodiment of the invention, and (ii) β-SiAlON:Eu phosphor (540 nm) and CSS red phosphor (630 nm)
Figure 13:
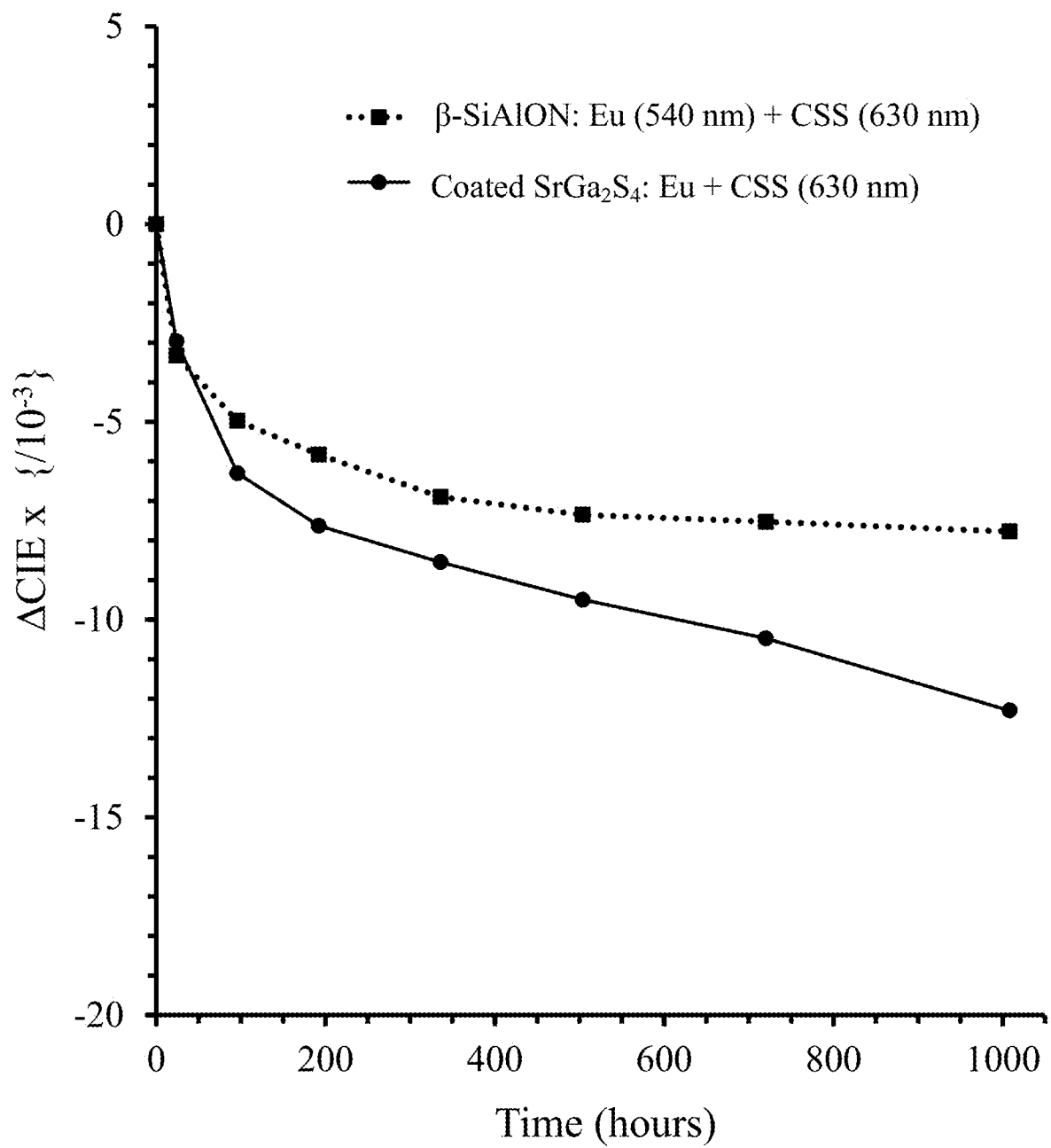
FIG. 13 shows reliability data, change of chromaticity ΔCIE x versus time, for a white light emitting device (SMD 7020 LED module) operated under accelerated testing conditions WHTOL 85° C./85% RH for a blue LED (450.0-452.5 nm) combined with (i) alumina coated NBG phosphor and CSS red phosphor (630 nm) according to an embodiment of the invention, and (ii) β-SiAlON:Eu (540 nm) phosphor and CSS red phosphor (630 nm)
Figure 14:
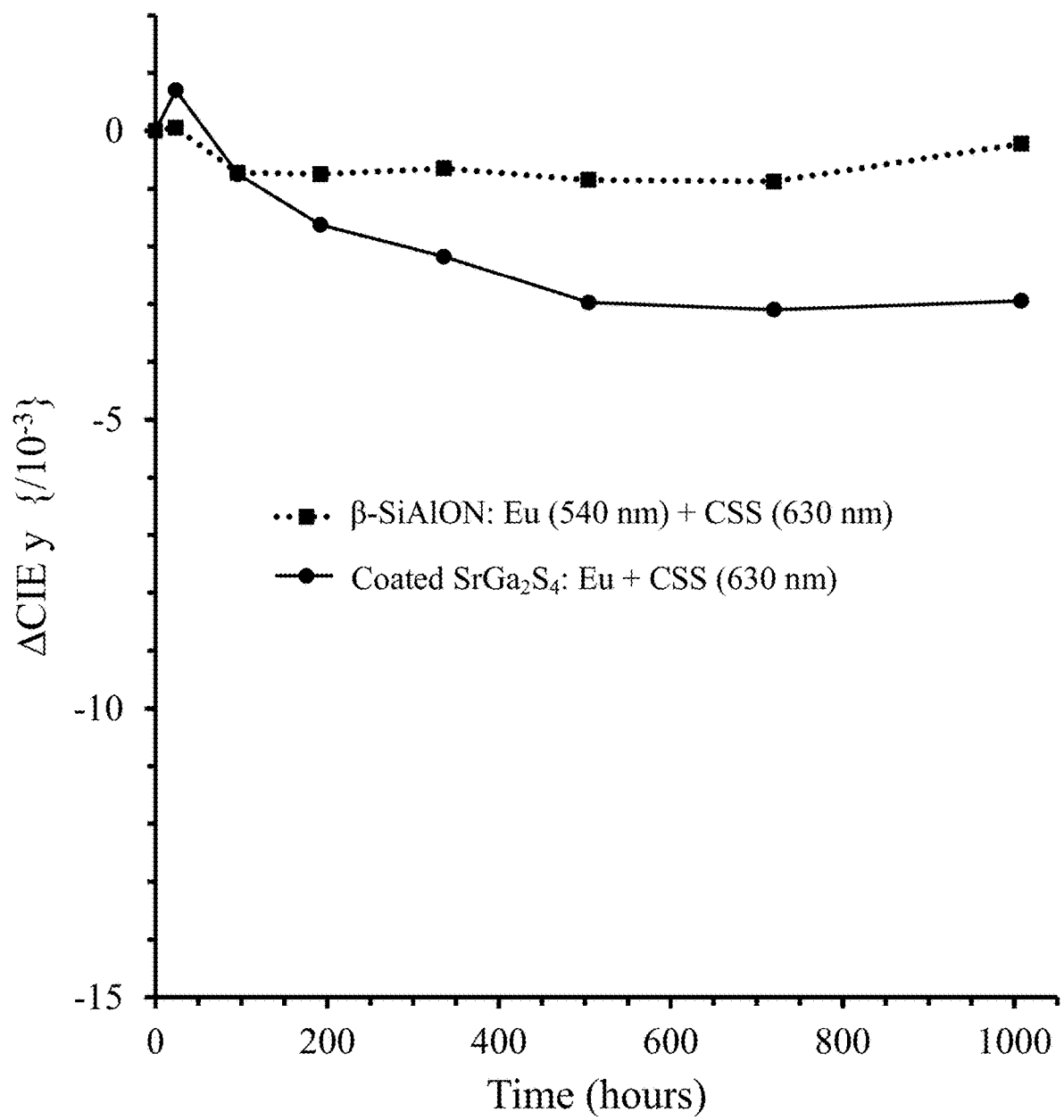
FIG. 14 shows reliability data, change of chromaticity ΔCIE y versus time, for a white light emitting device (SMD 7020 LED module) operated under accelerated testing conditions WHTOL 85° C./85% RH for a blue LED (450.0-452.5 nm) combined with (i) alumina coated NBG phosphor and CSS red phosphor according to an embodiment of the invention, and (ii) β-SiAlON:Eu (540 nm) phosphor and CSS red phosphor (630 nm)

FIG. 12 shows reliability data, relative photoluminescence intensity versus time, for a white light emitting device (SMD 7020 LED module) operated under accelerated testing conditions WHTOL 85° C./85% RH for a blue LED (450.0-452.5 nm) combined with (i) alumina coated NBG phosphor and CSS red phosphor (alumina coated $CaSe_{1-x}S_x$:Eu; 630 nm), according to an embodiment of the invention, and (ii) β-SiAlON:Eu phosphor (540 nm) and CSS red phosphor (630 nm). FIG. 13 shows reliability data, change of chromaticity ΔCIE x versus time, for the same samples as in FIG. 12. FIG. 14 shows reliability data, change of chromaticity ΔCIE y versus time, for the same samples as in FIGS. 12 & 13.

Figure 15:
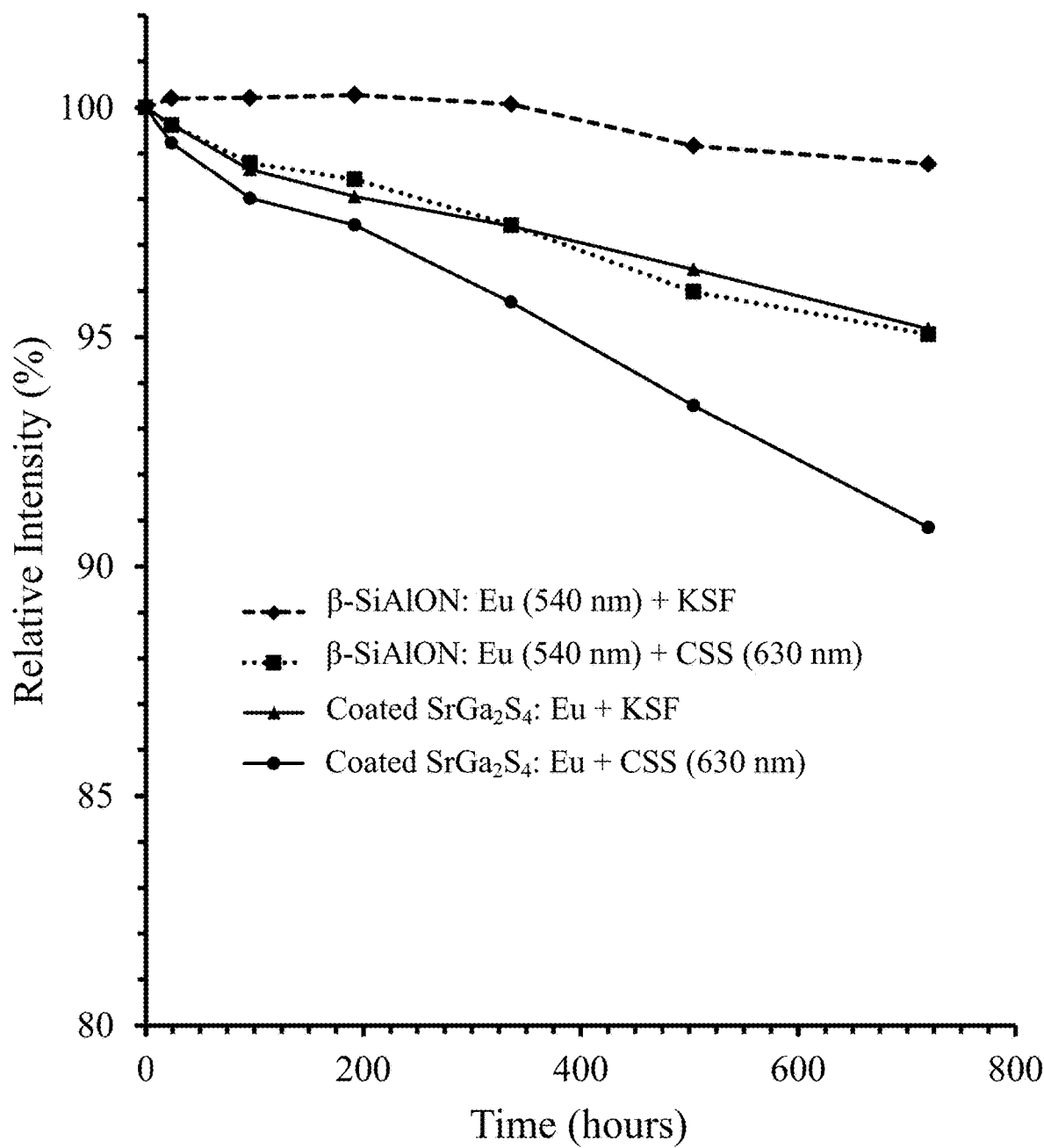
FIG. 15 shows reliability data, relative photoluminescence intensity versus time, for a white light emitting device (SMD 7020 LED module) operated under accelerated testing conditions WHTOL 60° C./90% RH for a blue LED (450.0-452.5 nm) combined with (i) alumina coated NBG phosphor and KSF ($K_2SiF_6$:Mn) red phosphor, according to an embodiment of the invention, ii) alumina coated NBG phosphor and CSS red phosphor (630 nm), according to an embodiment of the invention, iii) β-SiAlON:Eu (540 nm) phosphor and KSF red phosphor, and (iv) β-SiAlON:Eu (540 nm) phosphor and CSS red phosphor (630 nm)
Figure 16:
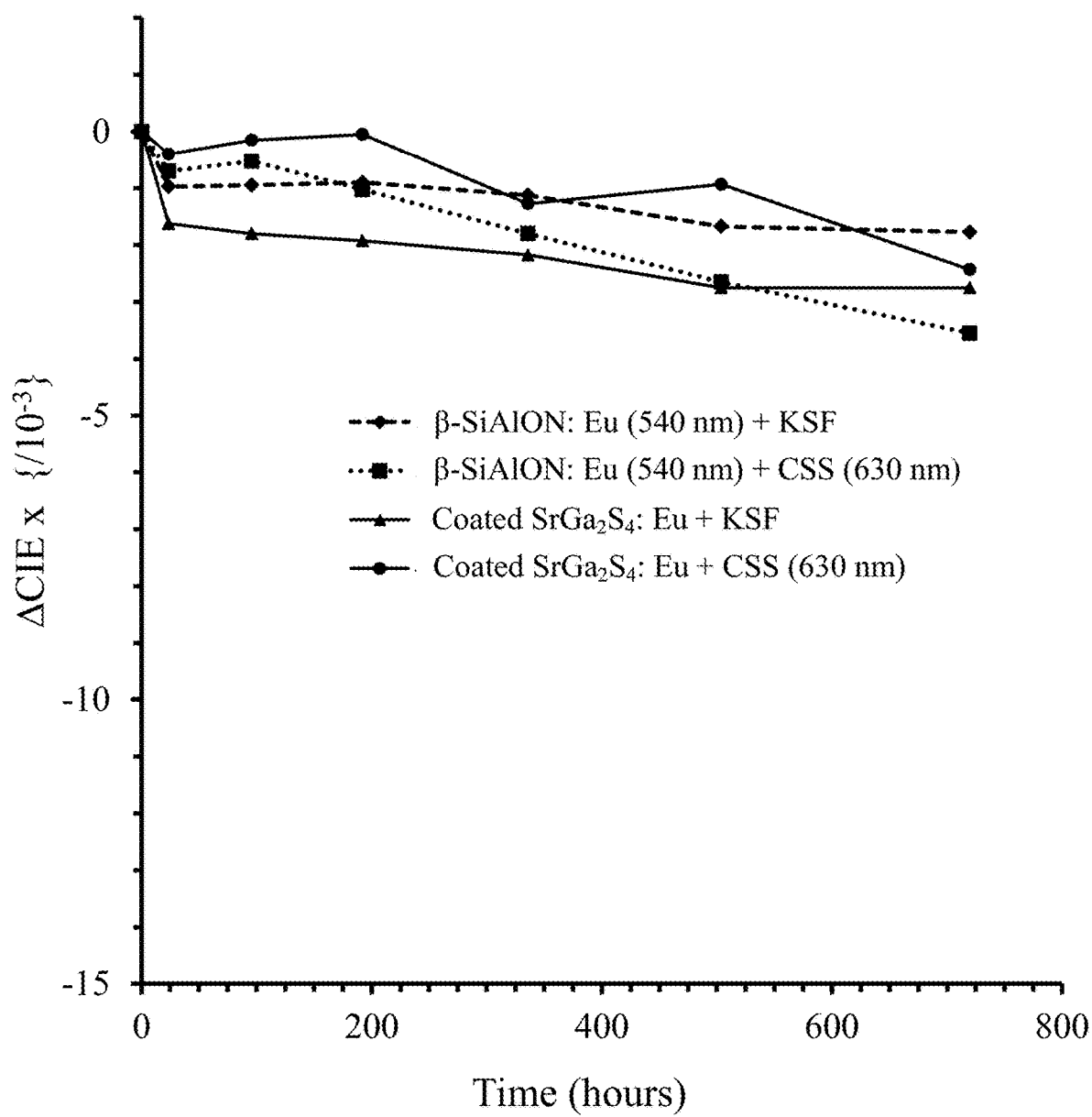
FIG. 16 shows reliability data, change of chromaticity ΔCIE x versus time, for a white light emitting device (SMD 7020 LED module) operated under accelerated testing conditions WHTOL 60° C./90% RH for a blue LED (450.0-452.5 nm) combined with (i) alumina coated NBG phosphor and KSF red phosphor, according to an embodiment of the invention, (ii) alumina coated NBG phosphor and CSS red phosphor (630 nm) according to an embodiment of the invention, (iii) β-SiAlON:Eu (540 nm) phosphor and KSF red phosphor, and (iv) β-SiAlON:Eu (540 nm) phosphor and CSS red phosphor (630 nm)
Figure 17:
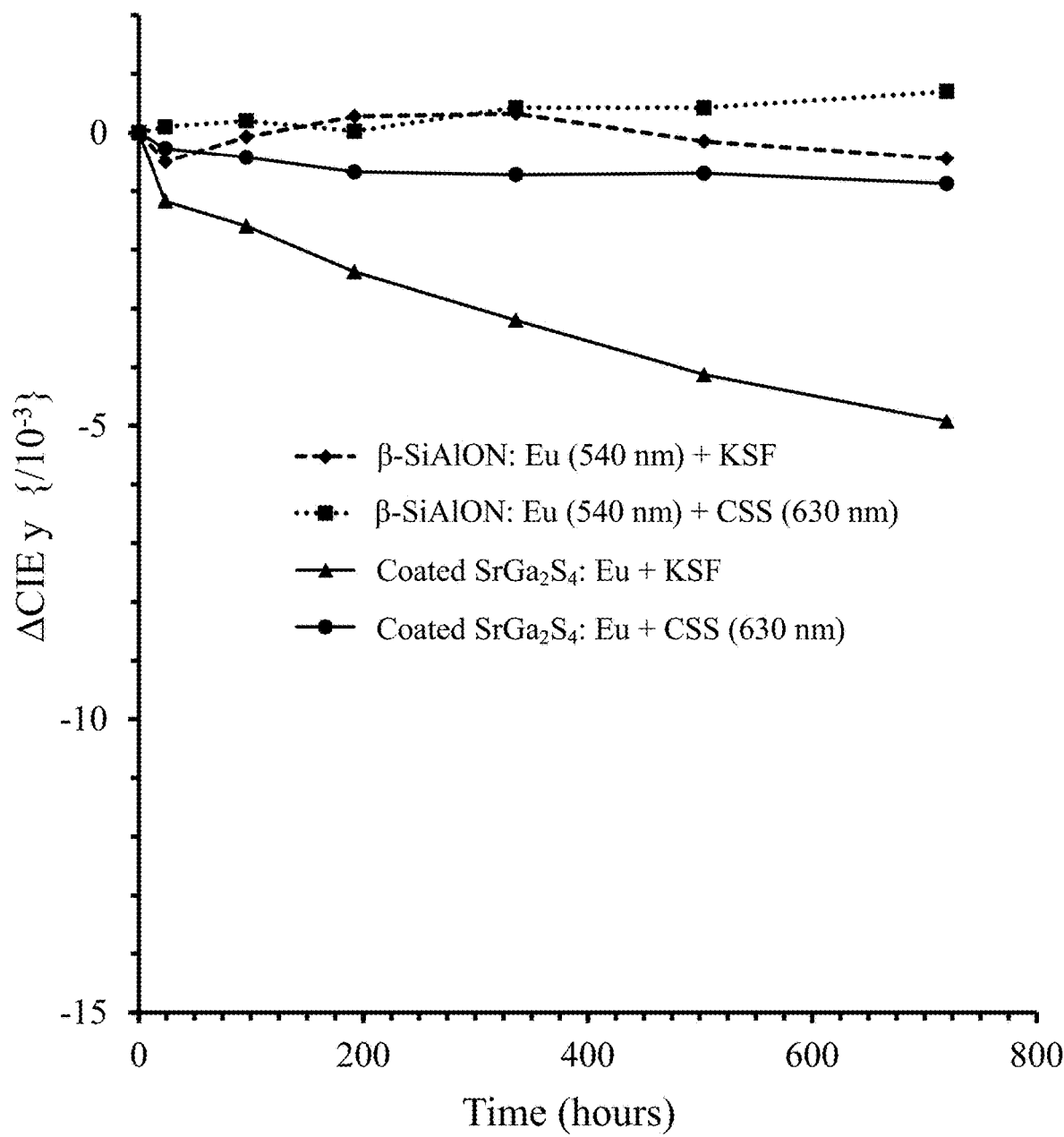
FIG. 17 shows reliability data, change of chromaticity ΔCIE y versus time, for a white light emitting device (SMD 7020 LED module) operated under accelerated testing conditions WHTOL 60° C./90% RH for a blue LED (450.0-452.5 nm) combined with (i) alumina coated NBG phosphor and KSF red phosphor, according to an embodiment of the invention, (ii) alumina coated NBG phosphor and CSS red phosphor (630 nm) according to an embodiment of the invention, (iii) β-SiAlON:Eu (540 nm) phosphor and KSF red phosphor, and (iv) β-SiAlON:Eu (540 nm) phosphor and CSS red phosphor (630 nm)

FIG. 15 shows reliability data, relative photoluminescence intensity versus time, for a white light emitting device (SMD 7020 LED module) operated under accelerated testing conditions WHTOL 60° C./90% RH for a blue LED (450.0-452.5 nm) combined with (i) alumina coated NBG phosphor and KSF ($K_2SiF_6$:Mn) red phosphor, according to an embodiment of the invention, ii) alumina coated NBG phosphor and CSS red phosphor (630 nm), according to an embodiment of the invention, iii) β-SiAlON:Eu (540 nm) phosphor and KSF red phosphor, and (iv) β-SiAlON:Eu (540 nm) phosphor and CSS red phosphor (630 nm). FIG. 16 shows reliability data, change of chromaticity ΔCIE x versus time, for the same samples as in FIG. 15. FIG. 17 shows reliability data, change of chromaticity ΔCIE y versus time, for the same samples as in FIGS. 15 & 16. The performance data for the 60° C./90% RH test—an industry alternative to the 85° C./85% RH test—is even better than for the 85° C./85% RH test.

Figure 18:
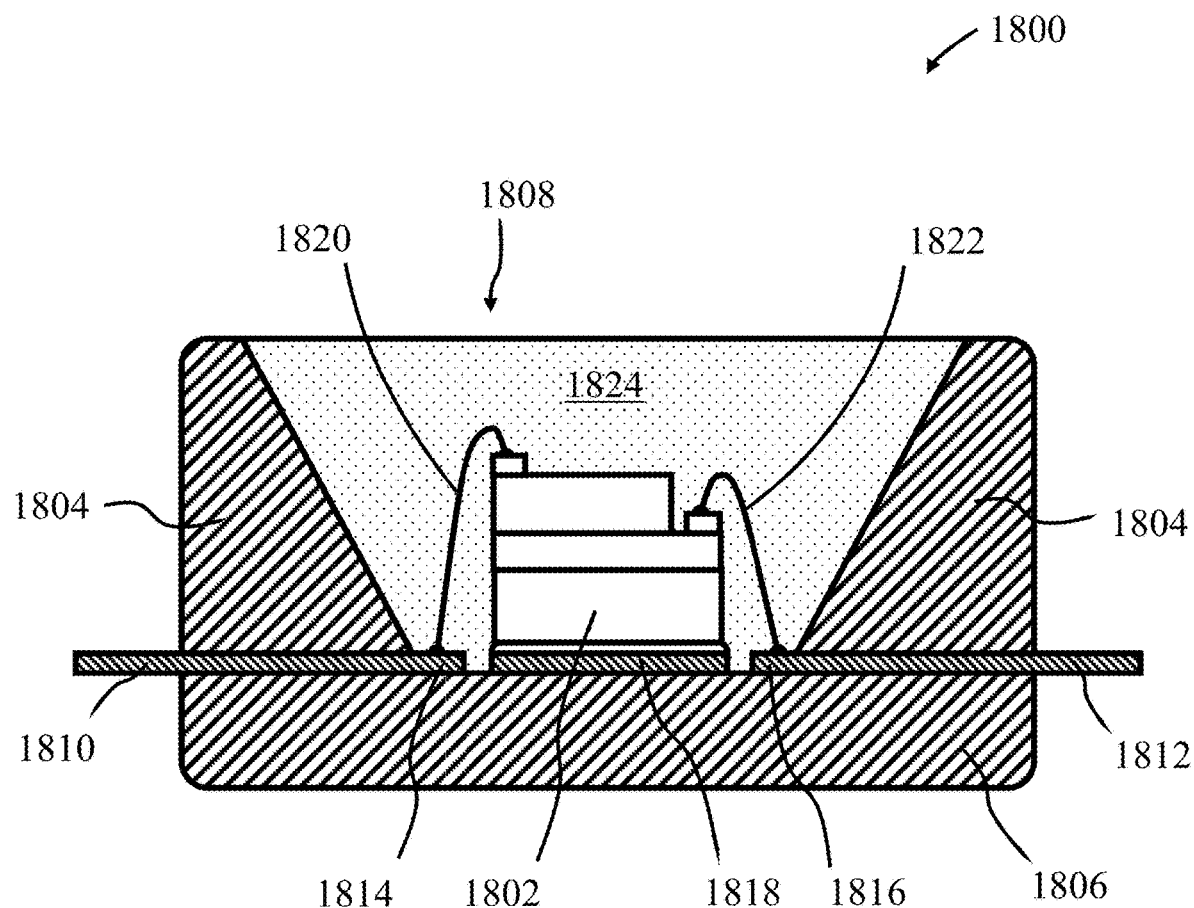
FIG. 18 shows a cross-sectional schematic representation of a white light emitting device, according to some embodiments of the invention.

Packaged White Light Emitting Device, for Display Backlight and General Lighting Device FIG. 18 illustrates a white light emitting device, according to some embodiments. The device 1800 can comprise a blue light emitting, within the range of 450 nm to 470 nm, GaN (gallium nitride) LED chip 1802, for example, housed within a package. The package, which can for example comprise a low temperature co-fired ceramic (LTCC) or high temperature polymer, comprises upper and lower body parts 1804, 1806. The upper body part 1804 defines a recess 1808, often circular in shape, which is configured to receive the LED chips 1802. The package further comprises electrical connectors 1810 and 1812 that also define corresponding electrode contact pads 1814 and 1816 on the floor of the recess 1808. Using adhesive or solder, the LED chip 1802 can be mounted to a thermally conductive pad 1818 located on the floor of the recess 1808. The LED chip's electrode pads are electrically connected to corresponding electrode contact pads 1814 and 1816 on the floor of the package using bond wires 1820 and 1822 and the recess 1808 is completely filled with a transparent polymer material 1822, typically a silicone, which is loaded with a mixture 1824 of a green phosphor and a red phosphor material of the present invention such that the exposed surfaces of the LED chip 1802 are covered by the phosphor/polymer material mixture. To enhance the emission brightness of the device the walls of the recess are inclined and have a light reflective surface.

As shown in Tables 18 & 19, the alumina coated NBG phosphor samples of the present invention exhibit higher NTSC and brightness compared to β-SiAlON:Eu phosphor.

Figure 19:
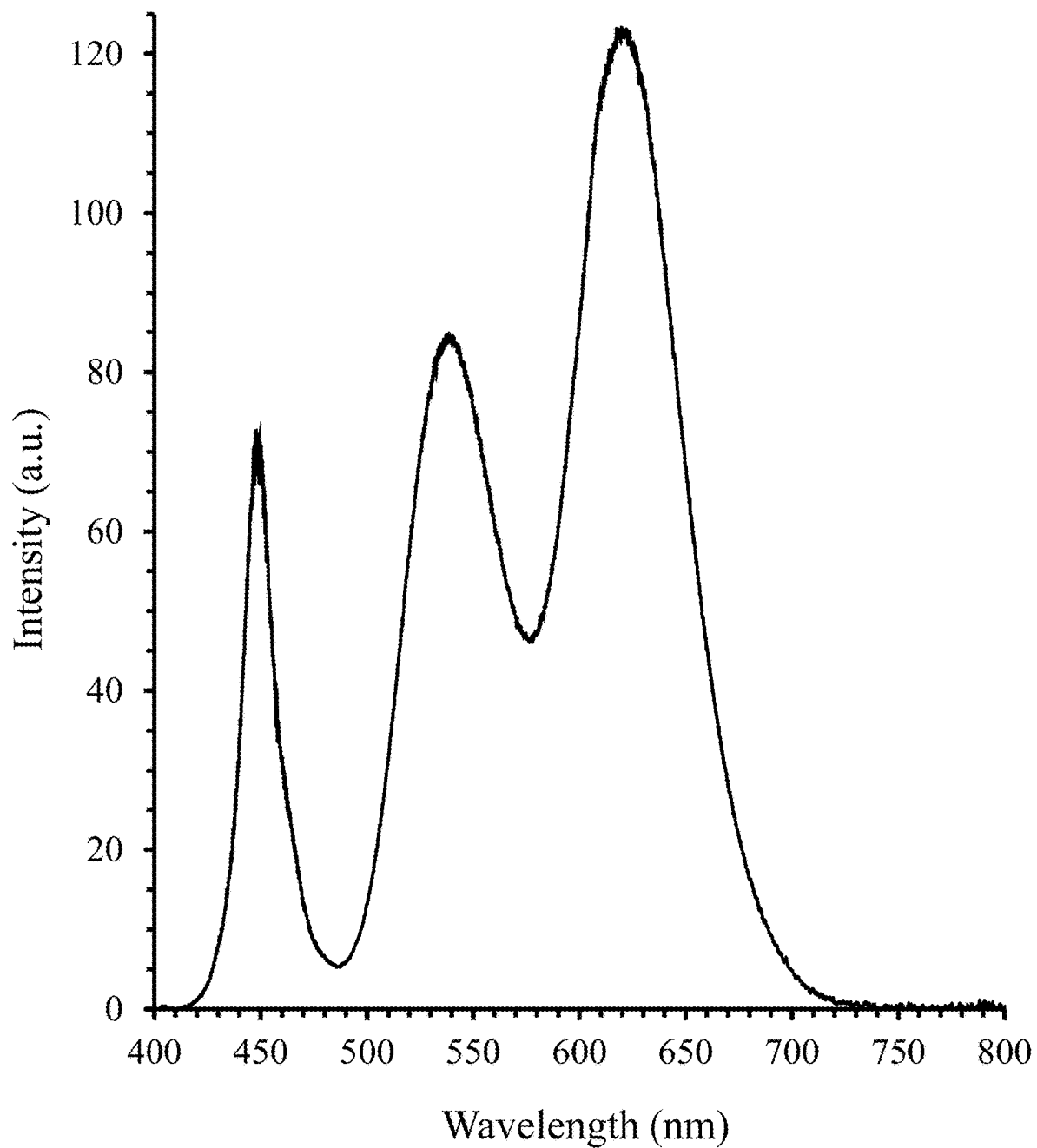
FIG. 19 shows a white light emission spectra of a 3000K white light emitting device comprising alumina coated NBG phosphor and CSS red phosphor, according to some embodiments of the invention.

FIG. 19 shows a white light emission spectra of a 3000K white light emitting device comprising alumina coated NBG phosphor (537 nm) and CSS red phosphor (626 nm), according to some embodiments of the invention.

Figure 20:
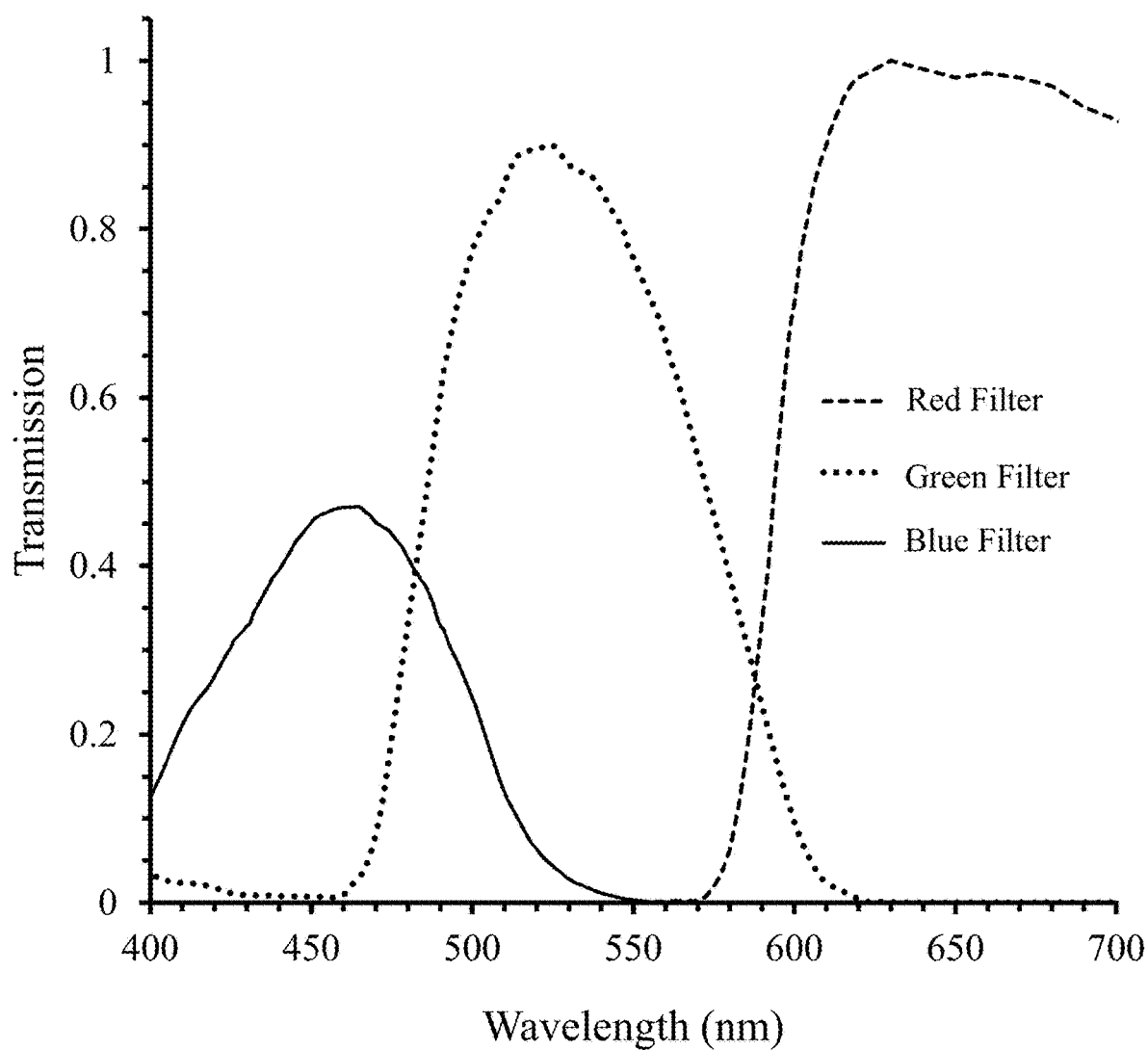
FIG. 20 shows the filtering characteristics, light transmission versus wavelength, for red, green and blue filter elements (Hisense) of an LCD display.

In addition to its applications in general LED lighting applications, due to its narrow band green and suitable wavelength, NBG phosphors can also be used in display backlighting. FIG. 20 shows the filtering characteristics, light transmission versus wavelength, for red, green and blue filter elements of a Hisense filter of an LCD display optimized for TV applications. FIGS. 21 & 22 show alumina coated NBG phosphor (537 nm), according to some embodiments, with red KSF phosphor, before and after filtering, respectively, which shows separation of blue, green and red peaks. Table 20 shows, when used with KSF, alumina coated NBG phosphor with an emission wavelength of about 537 nm can achieve 92% of the area of the NTSC standard. Note that the LCD white measurements are for an LCD operating to produce a white screen and using a backlight LED according to embodiments, and the LCD red/green/blue filter measurements are for light from the LCD which comes only through the particular color filter—red, green or blue.

TABLE 20

Optical Properties of white light emitting device:LED (452.0 nm) + alumina coated NBG (537 nm) + KSF - Hisense TV Color Filter

| Parameter | Value |
| --- | --- |
| Backlight LED CIE x | 0.2805 |
| Backlight LED CIE y | 0.2608 |
| Backlight LED Brightness (lm) | 44.1 |
| LCD white CIE x | 0.2865 |
| LCD white CIE y | 0.3080 |
| LCD Brightness (lm) | 43.7 |
| Brightness LCD/LED (%) | 99.1 |
| Red CIE x after LCD red filter | 0.6806 |
| Red CIE y after LCD red filter | 0.3041 |
| Green CIE x after LCD green filter | 0.2442 |
| Green CIE y after LCD green filter | 0.6605 |
| Blue CIE x after LCD blue filter | 0.1507 |

TABLE 18

Optical Properties of white light emitting devices (backlights) with a Hisense TV color filter - Cavity Test
Device 1: LED (452.0 nm) + alumina coated NBG (537 nm) + KSF
Device 2: LED (452.0 nm) + β-SiAlON:Eu (535 nm) + KSF

| Device | Phosphor per 100 g silicone (g) | Green phosphor (%) | Red phosphor (%) | Flux (lm) | Brightness (%) | CIE x | CIE y |
| --- | --- | --- | --- | --- | --- | --- | --- |
| 1 | 55 | 14.0 | 86.0 | 44.07 | 100.1 | 0.2805 | 0.2607 |
| 2 | 55 | 23.8 | 76.2 | 44.01 | 100.0 | 0.2805 | 0.2607 |

TABLE 19

Optical Properties of white light emitting devices (backlights) with a Hisense TV color filter - Cavity Test
Device 3: LED (455.1 nm) + alumina coated NBG (537 nm) + KSF
Device 4: LED (455.1 nm) + alumina coated NBG (5% Ca, 540 nm) + KSF

| Device | Phosphor per 100 g silicone (g) | Green phosphor (%) | Red phosphor (%) | Flux (lm) | Brightness (%) | CIE x | CIE y |
| --- | --- | --- | --- | --- | --- | --- | --- |
| 3 | 18 | 18.2 | 81.8 | 4.86 | 100.0 | 0.2806 | 0.2616 |
| 4 | 18 | 15.9 | 84.1 | 4.93 | 101.5 | 0.2806 | 0.2616 |

TABLE 20-continued

Optical Properties of white light emitting device:LED (452.0 nm) + alumina coated NBG (537 nm) + KSF - Hisense TV Color Filter

| Parameter | Value |
|---|---|
| Blue CIE y after LCD blue filter | 0.0691 |
| NTSC (%) | 92.1 |

FIG. 23 shows the filtering characteristics, light transmission versus wavelength, for red, green and blue filter elements of an AUO filter of an LCD display. (The AUO color filter is a thin filter often used in laptop and monitor applications.) FIGS. 21 & 24 show alumina coated NBG phosphor (537 nm), according to some embodiments, with red KSF phosphor, before and after filtering, respectively, which shows separation of blue, green and red peaks. Table 21 shows, when used with KSF, alumina coated NBG phosphor with an emission wavelength of about 537 nm can achieve 102% of the area of the NTSC standard.

TABLE 21

Optical Properties of white light emitting device:LED (452.0 nm) + alumina coated NBG (537 nm) + KSF - ALO (AU Optronics Corp) Color Filter

| Parameter | Value |
|---|---|
| Backlight LED CIE x | 0.2805 |
| Backlight LED CIE y | 0.2608 |
| Backlight LED Brightness (lm) | 44.1 |
| LCD white CIE x | 0.3272 |
| LCD white CIE y | 0.3391 |
| LCD Brightness (lm) | 36.5 |
| Brightness LCD/LED (%) | 102.6 |
| Red CIE x after LCD red filter | 0.6917 |
| Red CIE y after LCD red filter | 0.3081 |
| Green CIE x after LCD green filter | 0.2319 |
| Green CIE y after LCD green filter | 0.6843 |
| Blue CIE x after LCD blue filter | 0.1515 |
| Blue CIE y after LCD blue filter | 0.0439 |
| NTSC (%) | 102.6 |

White LEDs using combined blue LED and YAG:Ce phosphor have been widely used as backlights for personal computer LCD screens, LCD TVs and small-sized LCDs used in devices such as cellular phones and tablet displays. To date, the color gamut of these LEDs can attain approximately 70% of the area of the NTSC standard, and the widest color gamut using a narrow-band β-SiAlON:Eu green phosphor and CaAlSiN$_3$:Eu red phosphor can reach ~85% of the area of the NTSC standard with the assistance of typical LCD color filters. However, the combination of a coated NBG phosphor, as described herein, with an emission wavelength of about 537 nm, with a narrow band red phosphor, such as KSF, can reach approximately 92% of the area of the NTSC standard with a TV color filter. See FIG. 25 which shows the 1931 CIE color coordinates of the NTSC standard (callout 2510) and the calculated RGB coordinates from a white light source comprising a blue LED (451 nm) combined with the coated NBG phosphor of the present invention with the red narrow band phosphor KSF (callout 2530); this is the same white light source for which a spectrum is shown in FIG. 21 and described above in Table 20. Note that herein references to the percentage of the area of the NTSC standard are percentages of the area of the NTSC (National Television System Committee) 1953 color gamut specification as mapped on the CIE 1931 xy chromaticity diagram. Note that the combination of a β-SiAlON:Eu green phosphor and a KSF red phosphor is provided for comparison, and is seen to attain 89% of the area of the NTSC standard (callout 2520) with a TV color filter.

It is expected that some embodiments of the coated NBG phosphors of the present invention, when combined with one of the various possible narrow band red phosphors such as KSF or CSS are able to reach high efficiencies and high levels of color gamut for LED backlight applications, where the phosphors are integrated into "on-chip", "on-edge" or "on-film" LED backlights. Furthermore, it is expected that the performance of some embodiments of the coated narrow band green phosphors of the present invention in combination with one of the various possible narrow band red phosphors will provide higher efficiencies, better color purity and higher levels of color gamut compared with prior art phosphor combinations.

Remote Phosphor White Light Emitting Device

FIGS. 26A and 26B illustrate a remote phosphor solid-state white light emitting device, according to some embodiments. The device 2600 is configured to generate warm white light with a CCT (Correlated Color Temperature) of 2700K and a CRI (Color Rendering Index) of about 90. The device can be used as a part of a downlight or other lighting fixture. The device 2600 comprises a hollow cylindrical body 2602 composed of a circular disc-shaped base 2604, a hollow cylindrical wall portion 2606 and a detachable annular top 2608. To aid in the dissipation of heat, the base 2604 is preferably fabricated from aluminum, an alloy of aluminum or any material with a high thermal conductivity. The base 2604 can be attached to the wall portion 2606 by screws or bolts or by other fasteners or by means of an adhesive.

The device 2600 further comprises a plurality (four in the example illustrated) of blue light emitting LEDs 2612 (blue LEDs) that are mounted in thermal communication with a circular-shaped MCPCB (metal core printed circuit board) 2614. The blue LEDs 2612 can comprise a ceramic packaged array of twelve 0.4 W GaN-based (gallium nitride-based) blue LED chips that are configured as a rectangular array 3 rows by 4 columns. To maximize the emission of light, the device 2600 can further comprise light reflective surfaces 2616 and 2618 that respectively cover the face of the MCPCB 2614 and the inner curved surface of the top 2608.

The device 2600 further comprises a photoluminescent wavelength conversion component 2620 that is located remotely to the LEDs and operable to absorb a proportion of the blue light generated by the LEDs 2612 and convert it to light of a different wavelength by a process of photoluminescence. The emission product of the device 2600 comprises the combined light generated by the LEDs 2612 and the photoluminescent wavelength conversion component 2620. The photoluminescent wavelength conversion component may be formed of a light transmissive material (for example, polycarbonate, acrylic material, silicone material, etc.) and comprises a mixture of a yellow, red and/or green phosphor, including coated NBG phosphor material of the present invention. Furthermore, in embodiments the photoluminescent wavelength conversion component may be formed of a light transmissive material coated with one or more layers of phosphor materials as described above, including coated green phosphor material of the present invention. The wavelength conversion component is positioned remotely to the LEDs 2612 and is spatially separated from the LEDs. In this patent specification "remotely" and "remote" means in a spaced or separated relationship. The wavelength conversion component 2620 is configured to completely cover the housing opening such that all light emitted by the lamp passes through the component 2620. As shown the wavelength conversion component 2620 can be detachably mounted to the top of the wall portion 2606 using the top 2608 enabling the component and emission color of the lamp to be readily changed.

While in the above embodiment the phosphors are located in the photoluminescent wavelength conversion component it is contemplated in other embodiments to locate one of the phosphors in the photoluminescent wavelength conversion component and the other within a package housing the LEDs Although examples of the present invention have been described primarily with reference to NBG phosphor particles coated with a single material, in certain embodiments, it is envisaged that the coatings comprise multiple layers (two, three or more) with combinations of the coating materials described herein. Furthermore, the combination coatings may be coatings with an abrupt transition between adjacent coating materials, or may be coatings in which there is a gradual transition from one coating material to another coating material thus forming a zone with mixed composition that varies through the thickness of the coating.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A display backlight comprising:
   an excitation source with a dominant emission wavelength from 440 nm to 480 nm;
   a first phosphor of composition $(M)(A)_2S_4$:Eu in which,
   M is at least one of Mg, Ca, Sr and Ba, and
   A is at least one of Ga, Al, In, and Y,
     wherein said first phosphor has a moisture resistant coating of an oxide on individual particles of said first phosphor and a peak emission wavelength from 530 nm to 545 nm; and
   a second phosphor with a peak emission wavelength from 600 nm to 650 nm;
   wherein the backlight satisfies at least one of the conditions:
   (1) a reduction in relative intensity after 1,000 hours at 85° C. and 85% relative humidity is no greater than 20%;
   (2) a change in chromaticity coordinate CIE(y) after 1,000 hours at 85° C. and 85% relative humidity is no greater than $10 \times 10^{-3}$.

2. The display backlight of claim 1, wherein said first phosphor has a peak emission wavelength from 535 nm to 537 nm and a FWHM from 48 nm to 50 nm.

3. The display backlight of claim 1, wherein M is at least Sr and A is at least Ga.

4. The display backlight of claim 1, wherein said oxide comprises at least one of: alumina, aluminum oxide, silicon oxide, titanium oxide, zinc oxide, magnesium oxide, zirconium oxide and chromium oxide.

5. The display backlight of claim 1, wherein the display backlight generates light with a color gamut of at least 90% of NTSC.

6. The display backlight of claim 1, wherein at least one of the first and second phosphors is in a remote phosphor component.

7. The display backlight of claim 6, wherein said first phosphor is in the remote phosphor component and said second phosphor is with the excitation source.

8. The display backlight of claim 7, wherein the remote phosphor component is a film.

9. The display backlight of claim 8, wherein the second phosphor comprises at least one of $CaSe_{1-x}S_x$:Eu and $K_2SiF_6$:Mn.

10. A display backlight comprising:
    an excitation source with a dominant emission wavelength from 440 nm to 480 nm;
    a first phosphor of composition $(M)(A)_2S_4$:Eu in which,
    M is at least one of Mg, Ca, Sr and Ba, and
    A is at least one of Ga, Al, In, and Y,
      wherein said first phosphor has a moisture resistant coating of an oxide on individual particles of said first phosphor and a peak emission wavelength from 530 nm to 545 nm; and
    a second phosphor with a peak emission wavelength from 600 nm to 650 nm comprising at least one of $CaSe_{1-x}S_x$:Eu and $K_2SiF_6$:M;
    wherein the display backlight generates light with a color gamut of at least 90% of NTSC.

11. The display backlight of claim 10, wherein M is at least Sr and A is at least Ga.

12. The display backlight of claim 10, wherein said oxide comprises at least one of: alumina, aluminum oxide, silicon oxide, titanium oxide, zinc oxide, magnesium oxide, zirconium oxide and chromium oxide.

13. The display backlight of claim 10, wherein said second phosphor is with the excitation source and said first phosphor is in a film remote to the excitation source.

14. A coated phosphor comprising:
    phosphor particles of composition $(M)(A)_2S_4$:Eu in which,
    M is at least one of Mg, Ca, Sr and Ba, and
    A is at least one of Ga, Al, In, Y,
    wherein said phosphor particles have a moisture resistant coating of an oxide on individual phosphor particles and said coating has a thickness from 100 nm to 5 µm; and wherein said coated phosphor satisfies at least one of the conditions:
    (i) a reduction in relative intensity after 1,000 hours at 85° C. and 85% relative humidity is no greater than 30%;
    (ii) a change in chromaticity coordinate CIE(y) after 1,000 hours 85° C. and 85% relative humidity is no greater than $5 \times 10^{-3}$;
    (iii) a change in chromaticity coordinate CIE(y) after 1,000 hours at 85° C. and 85% relative humidity is no greater than $3 \times 10^{-3}$;
    (iv) a reduction in relative intensity after 1,000 hours at 85° C. and 90% relative humidity is no greater than 15%;
    (v) a change in chromaticity coordinate CIE(y) after 1,000 hours at 85° C. and 90% relative humidity is no greater than $5 \times 10^{-3}$;
    (vi) said coated phosphor does not turn black when suspended in a 1 mol/L silver nitrate solution for at least two hours at 85° C.;
    (vii) said coated phosphor does not turn black when suspended in a 1 mol/L silver nitrate solution for at least one day at 20° C.; and
    (viii) said coated phosphor does not turn black when suspended in a 1 mol/L silver nitrate solution for at least 5 days at 20° C.

15. The coated phosphor of claim 14, wherein said coating has a thickness from 500 nm to 2 µm.

16. The coated phosphor of claim 14, wherein said phosphor particles have a size distribution $D_{50}$ from 5 μm to 15 μm.

17. The coated phosphor of claim 14, wherein said oxide comprises at least one of: alumina, aluminum oxide, silicon oxide, titanium oxide, zinc oxide, magnesium oxide, zirconium oxide and chromium oxide.

* * * * *